United States Patent
Lin et al.

(10) Patent No.: US 7,706,660 B2
(45) Date of Patent: Apr. 27, 2010

(54) MULTIPLE QUANTUM DOT WAVEGUIDES

(75) Inventors: Lih Y. Lin, Seattle, WA (US); Chia-Jean Wang, Bellevue, WA (US); Babak A. Parvis, Seattle, WA (US)

(73) Assignee: University of Washington, Seattle, WA (US)

(*) Notice: Subject to any disclaimer, the term of this patent is extended or adjusted under 35 U.S.C. 154(b) by 68 days.

(21) Appl. No.: 11/750,787

(22) Filed: May 18, 2007

(65) Prior Publication Data
US 2008/0085088 A1  Apr. 10, 2008

Related U.S. Application Data

(60) Provisional application No. 60/802,177, filed on May 19, 2006.

(51) Int. Cl.
*G02B 6/00* (2006.01)
*G02B 6/10* (2006.01)
*B05D 5/06* (2006.01)

(52) U.S. Cl. ............ 385/143; 385/14; 385/122; 385/129; 385/130; 385/141; 385/142; 427/162; 359/333; 359/342

(58) Field of Classification Search ........... 385/14, 385/122, 129, 130, 141, 142, 143; 427/162; 359/333, 342
See application file for complete search history.

(56) References Cited

U.S. PATENT DOCUMENTS 7,076,138 B2 * 7/2006 Rupasov et al. ............ 385/122

2005/0176029 A1  8/2005  Heller et al.

OTHER PUBLICATIONS

Wang et al., "Sub-Diffraction Limit Nano-Photonic Waveguides by Quantum Dot Array Structure —Modeling and Simulation," University of Washington, Seattle, WA (2004).*
Hegg et al., "Nano-Scale Quantum Dot Optical Transducers by Self-Assembly," IEEE pp. 107-108 (2005).
Hegg et al., "Nano-Scale Nanocrystal Quantum Dot Photodetectors," Optical Society of America, University of Washington, Seattle, WA (2006).
Huang et al, "Comparison of Cross-Talk Effects Between Colloidal Quantum Dot and Conventional Waveguides," Optics Letters 32(3):235-7 (2007).

(Continued)

*Primary Examiner*—Frank G Font
*Assistant Examiner*—Michael P Mooney
(74) *Attorney, Agent, or Firm*—Nixon Peabody LLP

(57) ABSTRACT

The present invention relates to an assembly of multiple waveguides which includes a substrate and a plurality of waveguides positioned on said substrate at locations effective to suppress cross-talk between different waveguides. The plurality of waveguides each comprise an elongate array of quantum dots extending between sets of first and second locations on the substrate. The waveguides are positioned to receive: (1) pumped light uniformly applied to the array to produce electron-hole pairs and to enable optical gain and (2) signal light at the first location to trigger an emission from the quantum dot at the first location and transmission of photons along the array to the second location. A light transmission system which includes this assembly as well as methods of making and using the assembly are also disclosed.

34 Claims, 20 Drawing Sheets

OTHER PUBLICATIONS

Kawazoe et al., "Demonstrating Nanophotonic Switching Using Near-Field Pump-Probe Photoluminescence Spectroscopy of CuCI Quantum Cubes," Journal of Microscopy 209(Pt.3):261-6 (2002).

Kawazoe et al., "Optical Nanofountain: A Biomimetic Device that Concentrates Optical Energy in a Nanometric Region," Applied Physics Letters 86:103102-1-103102-3 (2005).

Klimov, "Nanocrystal Quantum Dots," Los Alamos Science 28:214-20 (2003).

Klimov et al., "Optical Gain and Stimulated Emission in Nanocrystal Quantum Dots," Science 290:314-7 (2000).

Maier et al., "Experimental Demonstration of Fiber-Accessible Metal Nanoparticle Plasmon Waveguides for Planar Energy Guiding and Sensing," Applied Physics Letters 86:071103-1-071103-3 (2005).

Maier et al., "Local Detection of Electormagnetic Energy Transport Below the Diffraction Limit in Metal Nanoparticle Plasmon Waveguides," Nature Materials 2:229-32 (2003).

Quinten et al., "Electromagnetic Energy Transport Via Linear Chains of Silver Nanoparticles," Optics Letters 23 (17):1331-3 (1998).

Takahara et al., "Guiding of a One-Dimensional Optical Beam with Nanometer Diameter," Optics Letters 22(7):475-7 (1997).

Wang et al., "100-nm Quantum Dot Waveguides by Two-Layer Self-Assembly," IEEE pp. 177-178 (2005).

Wang et al., "DNA-Directed Self-Assembled Waveguides for Nanophotonics," University of Washington, Seattle, WA (2004).

Wang et al., "Modeling and Fabrication of Sub-Diffraction Nanophotonic Waveguides Constructed Via DNA-Directed Self-Assembled Quantum Dots," Optical Society of America, University of Washington, Seattle, WA (2005).

Wang et al., "Modeling and Simulation for a Nano-Photonic Quantum Dot Waveguide Fabricated by DNA-Directed Self-Assembly," IEEE Journal of Selected Topics in Quantum Electronics 11(2):500-9 (2005).

Wang et al., "Nanophotonic Waveguides by Self-Assembly of Multiple-Type Quantum Dots," Optical Society of America, University of Washington, Seattle, WA (2006).

Wang et al., "Self-Assembled nanophotonic Waveguides by DNA Hybridization," University of Washington, Seattle, WA (2005).

Wang et al., "Sub-Diffraction Limit Nano-Photonic Waveguides by Quantum Dot Array Structure—Modeling and Simulation," University of Washington, Seattle, WA (2004).

Wang et al., "Sub-Diffraction Light Transmission with a Self-Assembled Quantum Dot Waveguide," University of Washington, Seattle, WA (2005).

Wang et al., "Subdiffraction Photon Guidance by Quantum-Dot Cascades," Nano Letters 6(11):2549-53 (2006).

Won, "Nanophotonics: Guiding the Way," Nature Photonics (Published Online Nov. 9, 2006).

Brongersma et al., "Electromagnetic Energy Transfer and Switching in Nanoparticle Chain Arrays Below the Diffraction Limit," Physical Review 62(24):R16356-R16359 (2000).

Chen et al., "Subwavelength Confinement in an Integrated Metal Slot Waveguide on Silicon," Optics Letters 31 (14):2133-5 (2006).

Maier et al., "Low-loss Fiber Accessible Plasmon Waveguide for Planar Energy Guiding and Sensing," Applied Physics Letters 84(20):3990-2 (2004).

Maier et al., "Observation of Coupled Plasmon-polariton Modes in Au Nanoparticle Chain Waveguides of Different Lengths: Estimation of Waveguide Loss," Applied Physics Letters 81(9):1714-6 (2002).

Maier et al., "Observation of Near-field Coupling in Metal Nanoparticle Chains Using Far-field Polarization Spectroscopy," Physical Review 65:193408-1-193408-4 (2002).

Maier et al., "Optical Pulse Propagation in Metal Nanopartical Chain Waveguides," Physical Review 67:205402-1— 205402-5 (2003).

Ohtsu et al., "Nanophotonics: Design, Fabrication, and Operation of Nanometric Devices Using Optical Near Fields," IEEE Journal of Selected Topics in Quantum Electronics 8(4):839-62 (2002).

Sweatlock et al., "Highly Confined Electromagnetic Fields in Arrays of Strongly Coupled Ag Nanoparticles," Physical Review 71:235408-1-235408-7 (2005).

Tanaka et al., "Simulations of Nanometric Optical Circuits Based on Surface Plasmon Polariton Gap Waveguide," Applied Physics Letters 82(8):1158-60 (2003).

Heller et al., "Fabrication of Photonic Transfer DNA-Quantum Dot Nanostructures," NSTI-Nanotech 1:769-72 (2005).

McMillan et al., "Ordered Nanoparticle Arrays Formed on Engineered Chaperonin Protein Templates," Nature Materials 1:247-52 (2002).

Ohtsu, "Nanotechnology and Nano/Atom Photonics by Optical Near-field," Plenary Paper, Optical Engineering for Sensing and Nanotechnology, Proceedings of SPIE 4416:1-13 (2001).

Towe, "Semiconductor Nanostructures: New Media for Active and Passive Photonic Devices," American Physical Society, March meeting 2004, Mar. 22-26,2004, Palais des Congres de Montreal, Montreal, Quebec, Canada (Abstract).

Wang, "Nanophotonic Waveguides by Self-Assembled Quantum Dots," UWEE Technical Report, No. UWEETR-2004-0030 (Dec. 28, 2004).

* cited by examiner

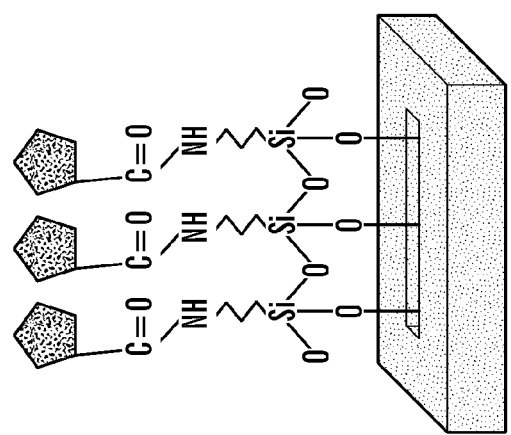
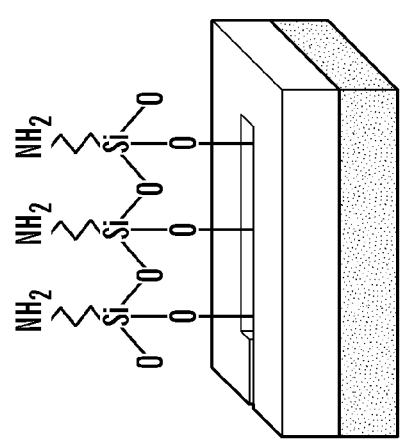
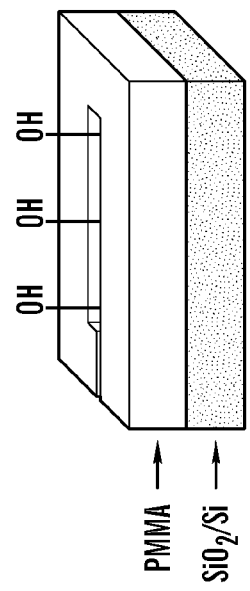
FIG. 3C
FIG. 3B
FIG. 3A

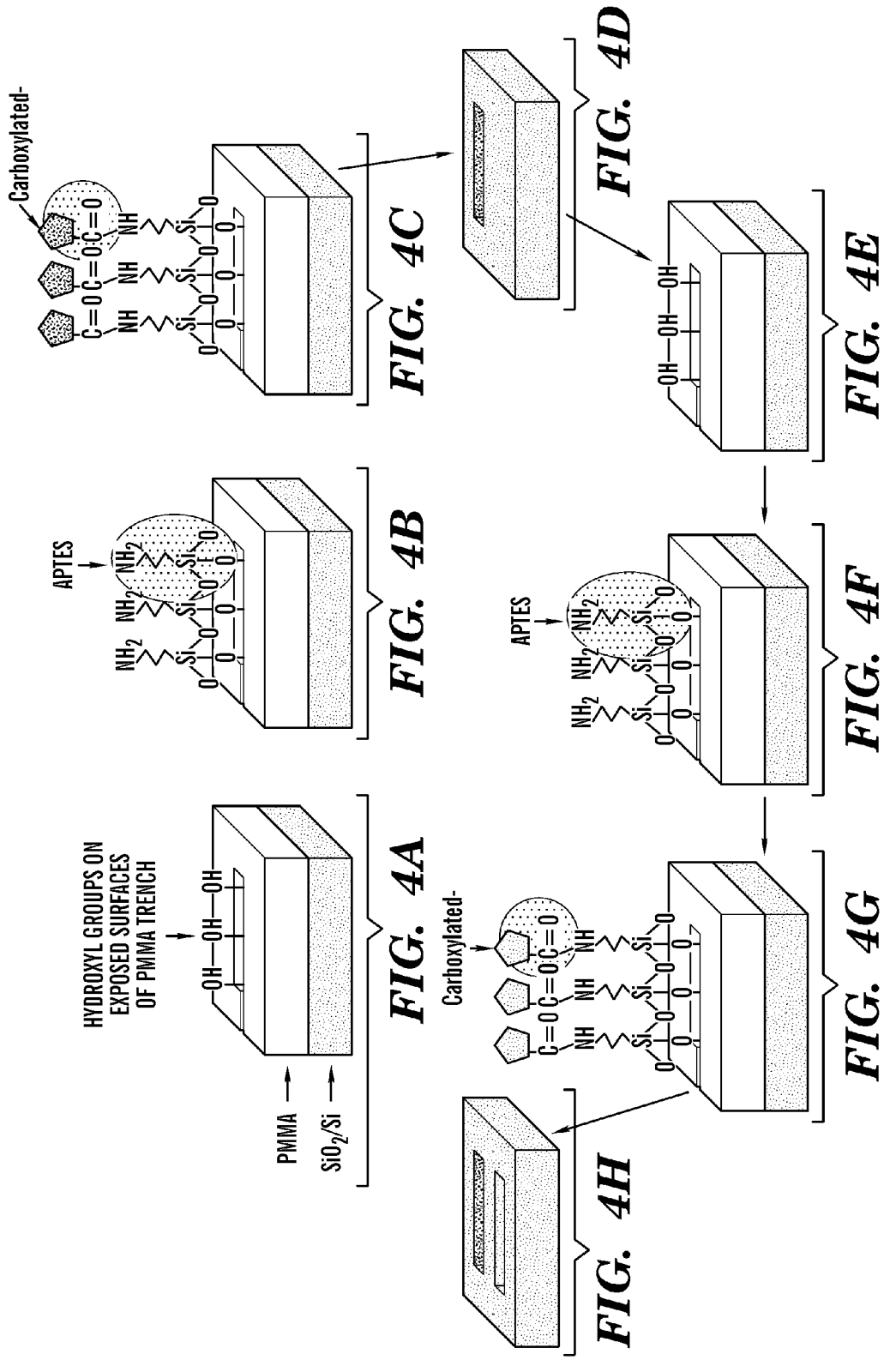

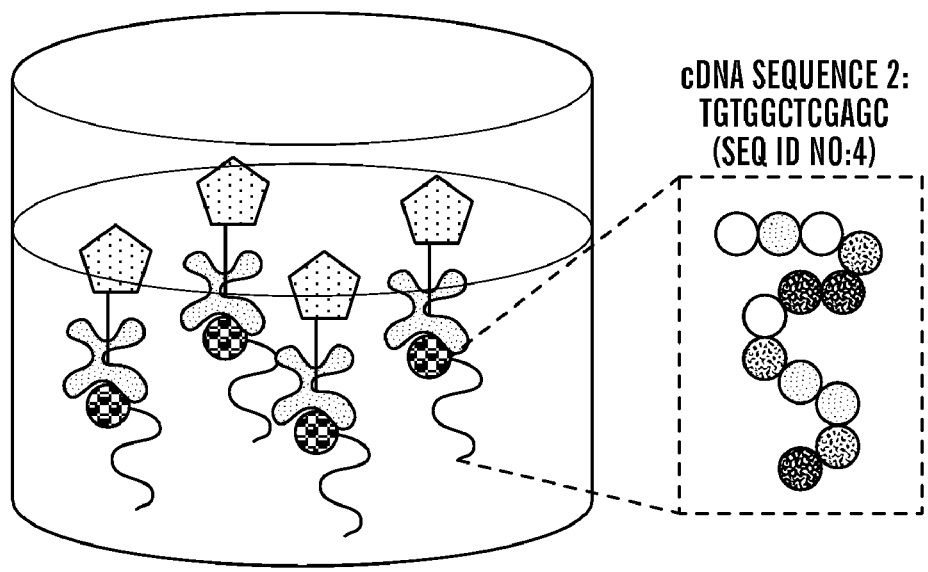
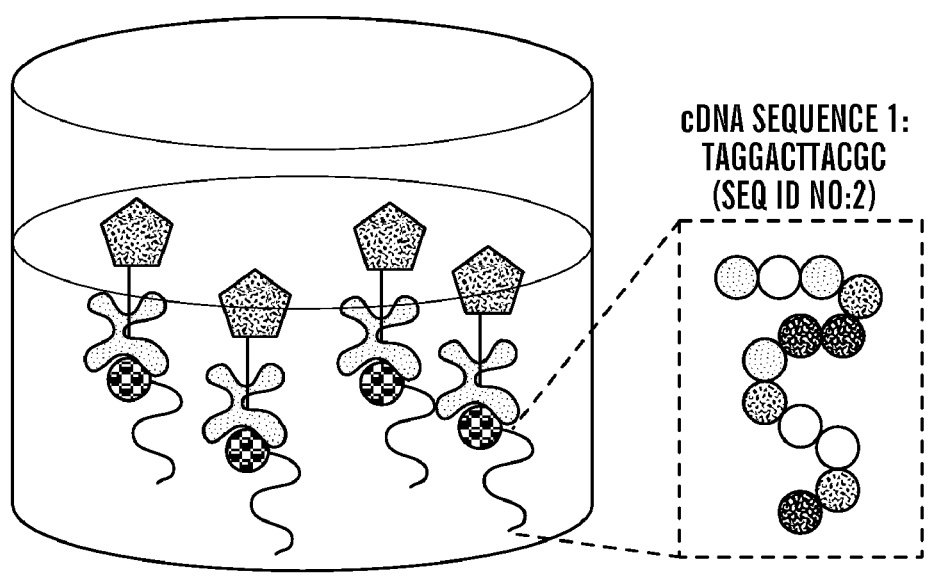
FIG. 5B

SEQUENCE LISTING

```
<160> NUMBER OF SEQ ID NOS: 4

<210> SEQ ID NO 1
<211> LENGTH: 12
<212> TYPE: DNA
<213> ORGANISM: artificial
<220> FEATURE:
<223> OTHER INFORMATION: DNA sequence for quantum dot waveguide
      fabrication

<400> SEQUENCE: 1
atcctgaatg cg                                                        12

<210> SEQ ID NO 2
<211> LENGTH: 12
<212> TYPE: DNA
<213> ORGANISM: artificial
<220> FEATURE:
<223> OTHER INFORMATION: DNA sequence for quantum dot waveguide
      fabrication

<400> SEQUENCE: 2
taggacttac gc                                                        12

<210> SEQ ID NO 3
<211> LENGTH: 12
<212> TYPE: DNA
<213> ORGANISM: artificial
<220> FEATURE:
<223> OTHER INFORMATION: DNA sequence for quantum dot waveguide
      fabrication

<400> SEQUENCE: 3
gctcgagcca ca                                                        12

<210> SEQ ID NO 4
<211> LENGTH: 12
<212> TYPE: DNA
<213> ORGANISM: artificial
<220> FEATURE:
<223> OTHER INFORMATION: DNA sequence for quantum dot waveguide
      fabrication

<400> SEQUENCE: 4
tgtggctcga gc                                                        12
```

MULTIPLE QUANTUM DOT WAVEGUIDES

This application claims the benefit of U.S. Provisional Patent Application Ser. No. 60/802,177, filed May 19, 2006, which is hereby incorporated by reference in its entirety.

FIELD OF THE INVENTION

The present invention is directed to multiple quantum dot waveguides, methods of making and using these waveguides, as well as light transmission systems.

BACKGROUND OF THE INVENTION

Currently, the inability to easily guide light at sub-diffraction limit dimensions prevents the manufacture of ultra-high density photonic circuits. To capture the inherent advantages of large bandwidth, capacity, and high speed modulation, research in the area has been underway for over a decade. While a number of proposed structures like the one-dimensional negative dielectric (Takahara et al., *Optics Lett.* 22:475 (1997)) and silicon-on-insulator photonic crystal (Bogaerts et al., *IEEE J. of Lightwave Technol.* 23:401 (2005)) waveguides enable nanoscale signal transmission, challenges with integration and packaging dimensions remain. Alternatively, plasmon excitation through metal nanoparticle arrays presents a method of guiding energy using sub-micron structures. Nominally, the device is made from a 1D array of Ag, Au, or Al nanoparticles self-assembled through sputtering, ion implantation, thermal evaporation, and lift-off (Brongersma et al., *Phys. Rev. B*, 62:R16356 (2000); Maier et al., *Appl. Phys. Lett.* 4:3990 (2004); and Yatsui et al., *Nano Lett.* (2005)). Still, negative dielectrics, such as metals, are subject to resistive heating and loss, and require conversion to translate plasmonic to optical energy.

The present invention is directed to overcoming these and other deficiencies in the art.

SUMMARY OF THE INVENTION

The present invention relates to an assembly of multiple waveguides which includes a substrate and a plurality of waveguides positioned on said substrate at locations effective to suppress cross-talk between different waveguides. The plurality of waveguides each comprise an elongate array of quantum dots (QDs) extending between sets of first and second locations on the substrate. The waveguides are positioned to receive: (1) pumped light uniformly applied to the array to produce electron-hole pairs and to enable optical gain and (2) signal light at the first location to trigger an emission from the quantum dot at the first location and transmission of photons along the array to the second location.

The present invention further relates to a method of making an assembly of multiple waveguides which includes providing a substrate and attaching a plurality of linker sets to the substrate. Each linker set is attached to the substrate sequentially and positioned between different sets of first and second locations on the substrate. Quantum dots are coupled to each of the plurality of linker sets to produce a plurality of waveguides positioned on the substrate at locations effective to suppress cross-talk between different waveguides. The plurality of waveguides each comprises an elongate array of quantum dots extending between the different sets of first and second locations on the substrate. This plurality of waveguides is positioned to receive: (1) pumped light uniformly applied to the array to produce electron-hole pairs and to enable optical gain and (2) signal light at the first location of an array to trigger an emission from the quantum dot at the first location and transmission of photons along the array to the second location of that array.

The use of quantum dots, a semiconducting nanoparticle, to form waveguides allows for self-assembly by chemical bonding, reduction of propagation loss, and flexibility in design since electrical and optical signals are both appropriate means of excitation. For the first point, conjugating QDs to molecules with selective chemistry and terminal linkers produces specific attachment schemes that enhance its use and versatility. As for the latter two advantages, the gain mechanism hinges on operation by a pump source to create population inversion of excited electrons to generate net emission over absorption, similar to optical amplifying action. Indeed, the process has been proven over the past decade, where QD lasers have been successfully demonstrated with lower threshold current density compared to those made from bulk material with sharp emission peaks due to the three-dimensional quantum confinement nature of the particle (Ledentsov et al., *IEEE J. Select. Topics Quantum Electron.* 6:439 (2000); Ustinov et al., *Quantum Dot Lasers*; Oxford University Press: Oxford, (2003); and Asada et al., *IEEE J. Quantum Electron.* 22:1915 (1986)). Consequently, the propagating wave may not only experience less transmission loss but an increase in strength as well. In view of the unique advantages of quantum dots, they are highly suitable for use as new nano-scale photonic waveguide structure.

BRIEF DESCRIPTION OF THE DRAWINGS

In FIG. 2A, an e-beam lithography (EBL) pattern polymethylmethacrylate (PMMA) coated substrate is treated with $O_2$ plasma. As shown in FIG. 2B, an 3'-mercaptopropyltrimethoxysilane (MPTMS) monolayer is deposited. FIG. 2C shows covalent binding with 5' acrydite-DNA. FIG. 2D shows hybridization with biotin-modified complementary (cDNA). FIG. 2E shows binding streptavidin-QDs to biotin-cDNA sites and removal of PMMA with dichloromethane.

FIG. 3A-C show two-layer QD waveguide fabrication. FIG. 3A shows the use of EBL to write and then develop a pattern on substrate coated with PMMA. The resulting substrate is then treated with oxygen plasma to create hydroxyl groups on surface. FIG. 3B shows the deposition of a monolayer of 3'-aminopropyltriethoxysilane (APTES). In FIG. 3C, carboxylated QDs are covalently bonded to the amine terminal with linking reagent, and the PMMA is stripped with dichloromethane.

FIGS. 4A-H show the fabrication of multi-type QD waveguides using the APTES self-assembly method. In FIG. 4A, an $SiO_2$/Si sample coated with PMMA is EBL patterned, the PMMA is developed, and the surface is treated with oxygen plasma to create hydroxyl groups on surface. FIG. 4B shows the solution phase deposition of APTES. In FIG. 4C, a first type of carboxylated QDs are covalently bound to the amine groups of APTES. FIG. 4D shows the stripping of PMMA, revealing a first QD pattern. FIGS. 4E-4H show a repeat of the steps shown in FIGS. 4A-D, respectively, to reveal both QD patterns.

FIGS. 5A-D show the fabrication of multiple type QD waveguides using the DNA self-assembly method. In FIG. 5A, 5' acrydite-DNA #1 and #2 is patterned by two consecutive EBL processes and binds covalently to the substrate. Streptavidin-QDs with biotin-modified cDNA are shown in FIG. 5B. In FIG. 5C the 5' acrydite-DNA treated substrate is placed into mixed solutions and hybridization of cDNA #1 with DNA #1 and cDNA #2 with DNA #2 is permitted to occur. FIG. 5D shows the removal of PMMA.

FIG. 8A shows the XPS results confirming MPTMS deposition through sulfur content on substrate. FIG. 8B depicts a fluorescence micrograph of 5 μm×1 μm to 1 μm×1 μm patterns and 1 μm width waveguide.

FIG. 9A shows QD fluorescence. FIG. 9B shows a scanning electron micrograph (SEM). FIG. 9C depicts a design CAD layout.

FIG. 11A shows XPS confirming APTES deposition through nitrogen content. FIG. 11B shows a fluorescence micrograph of 500 nm and 100 nm wide waveguides in (i) single and pair formations spaced, (ii) 200 nm, and (iii) 500 nm apart. FIG. 11C shows the corresponding atomic force micrographs of waveguides. The scale bar in FIGS. 11B and 11C is 1 μm.

FIG. 13A shows the results for a 10 μm straight waveguide, while FIG. 13B shows the results for a 10 μm×10 μm corner waveguide. In both cases, the waveguides are patterned on the same substrate, demonstrating higher signal on the waveguide rather than on substrate. The inset of FIG. 13B is the fluorescent micrograph of the corner waveguide; the scale bar is 2 μm. The scale bar in FIGS. 13A and 13B is 1 μm.

DETAILED DESCRIPTION OF THE INVENTION

The present invention relates to an assembly of multiple waveguides which includes a substrate and a plurality of waveguides positioned on said substrate at locations effective to suppress cross-talk between different waveguides. The plurality of waveguides each comprise an elongate array of quantum dots extending between sets of first and second locations on the substrate. The waveguides are positioned to receive: (1) pumped light uniformly applied to the array to produce electron-hole pairs and to enable optical gain and (2) signal light at the first location to trigger an emission from the quantum dot at the first location and transmission of photons along the array to the second location.

Figure 1:
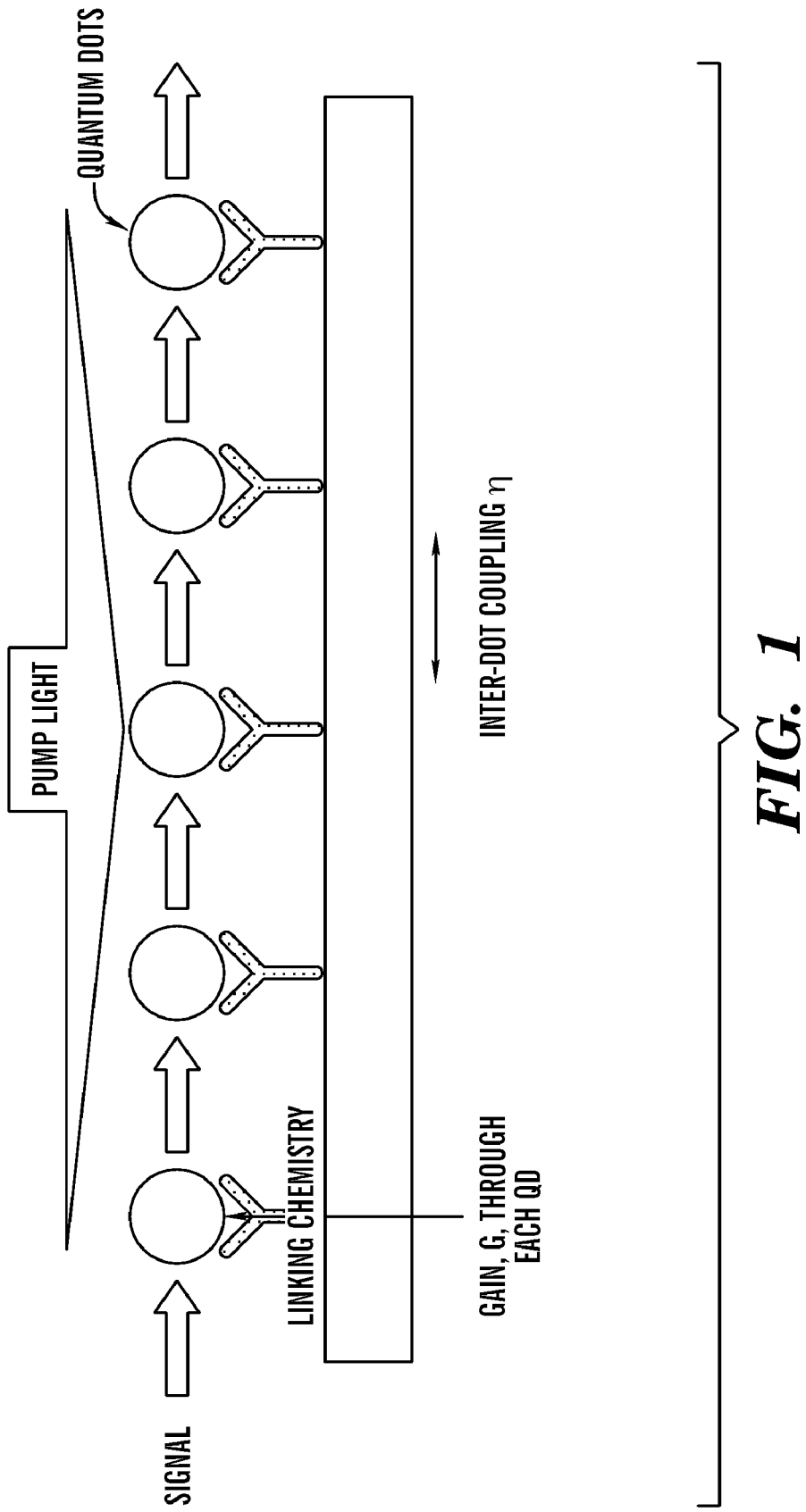
FIG. 1 shows a nanophotonic waveguide in operation: a pump source excites electrons to the second energy state in the conduction band of the quantum dot to generate gain. Subsequently, a signal light corresponding to the first excited state is placed at the waveguide edge to cause stimulated emission as electron-hole pairs recombine and the photons propagate downstream to produce an output signal mediated by the inter-dot coupling.

The assembly of the present invention is shown in FIG. 1. As this figure shows, a plurality of quantum dots are coupled to the substrate by linking chemistry. A pump laser, with energy equal to the separation of the second electron and hole states, shines pump light above to excite electron-hole (e-h+) pairs and enable gain. For a three state system, the e-h+ pairs quickly relax to the first conduction and valence band states, where without further manipulation, they will likely recombine for spontaneous emission of photon. However, by aligning a signal laser, which generates signal light of energy equivalent to the separation between the first electron and hole state to the input edge of the waveguide, photons generated by stimulated emission may cascade through the device creating an amplified output. Compared to other possible QD waveguide designs where QDs are formed through lattice mismatch between epitaxially-grown layers and waveguides are defined by etching the dielectric layer, the proposed design achieves simpler fabrication and eliminates the constraint from conventional dielectric waveguiding.

For a QD pumped with a continuous wave (CW) source, the quasi-Fermi energies are determined by the free carrier densities in the QD, which are obtained by solving the steady-state equation characterizing absorption and emission rates. The QD can be modeled as a three-level system that obeys k·p selection rule, whereby the ground, $1^{st}$, and $2^{nd}$ levels represent a recombined electron-hole ($e^-$-$h^+$) pair, an $e^-$-$h^+$ pair in the first quantized energy states, and an $e^-$-$h^+$ pair in the second quantized energy states, respectively. Accordingly, the steady-state rate equation is:

$$r_{abs,02} = r_{st.ems,20} + r_{sp.ems,20} + r_{sp.ems,10}, \quad (1)$$

where $r_{abs,02}$ represents the absorption of pump light to excite an $e^-$-$h^+$ pair from level 0 to level 2, $r_{st.ems,20}$ is the stimulated emission by the pump light, and $r_{sp.ems,20}$ is the spontaneous emission from direct recombination of $e^-$-$h^+$ pair in level 2. The $e^-$-$h^+$ pairs can also be relaxed from level 2 to level 1, in which case most of them then contribute to the stimulated emission and optical gain by the signal light. The remainder recombine to generate spontaneous emission between level 1 and 0, denoted by $r_{sp.ems,10}$. As a result, the rate equation is dependent on pump power, frequency of the pump light, quasi-Fermi energies, and positions of the quantized energy levels.

Combining (1) with the additional condition stating the equivalence between the number of electrons and holes allows one to solve for quasi-Fermi energies $E_{fc}$ and $E_{fv}$ at various pump powers. The solutions are applied to calculate the overall absorptions, emission, and gain spectrum. Subsequently, the gain coefficient, or gain per unit pump power, may be found to determine the optimal operating point of the QD. Using an ABCD matrix approach to further model the gain through each QD ($M_{QD}$) and the near-field coupling between adjacent QDs ($M_{prop}$), the waveguide transmission efficiency can be determined:

$$\begin{bmatrix} I_{out,+} \\ I_{out,-} \end{bmatrix} = M_{QD} \cdot (M_{prop} \cdot M_{QD})^{N-1} \cdot \begin{bmatrix} I_{in,+} \\ I_{in,-} \end{bmatrix}, \text{ where} \quad (2)$$

$$M_{QD} = \begin{bmatrix} 0 & 1 \\ -1 & 2e^{-G} \end{bmatrix}, \text{ and } M_{prop} = \begin{bmatrix} n & 0 \\ 0 & n^{-1} \end{bmatrix},$$

which shows the dependence on gain, G, and inter-dot coupling efficiency, η. The "+" and "−" subscripts represent the forward- and backward-propagating signals.

In the assembly, each of the waveguides can be straight or bent.

Each array of the substrate may contain quantum dots that are the same as one another but are different than those in other arrays on the substrate.

The substrate is made of a material capable of being functionalized with hydroxyl groups, such as silicon dioxide on silicon.

The substrate is functionalized with hydroxyl groups.

A linker couples the quantum dots to the substrate.

The linker may include a chemical linker, such as a silane chain with amine or mercapto/thiol terminations. Suitable linkers of this type are aminopropyltriethoxysilane or mercaptopropyltrimethoxysilane.

The linker may also include one or more nucleic acid molecule. For example, the linker can comprise a pair of complementary nucleic acid molecules, with one of the nucleic acid molecules coupled to the substrate and one of the nucleic acid molecules coupled to the quantum dot. Alternatively, the linker includes a single nucleic acid molecule.

As part of linker, each quantum dot may be coupled to the substrate with a streptavidin-biotin binding pair or through amine-carboxyl coupling with a zero-linker coupling reagent, such as 1-ethyl-3-(3'-dimethylaminopropyl)-carbodiimide (EDC).

Suitable quantum dots are made from semiconducting elements such as those composed of Group I-VII elements, Group II-VI elements, or Group III-V elements. The quantum dots can have a core only or core/shell configuration.

The assembly can be part of a light transmission system which additionally includes one or more sources of pump light positioned to uniformly apply light to the arrays to produce electron-hole pairs and to enable optical gain. This system further includes one or more sources of signal light positioned to trigger an emission from the quantum dot at the first location of a set and transmission of photons along the array to the second location of a set. A light receiver is positioned to receive photon transmission at the second location of a set.

The assembly can be used in a method of transmitting a plurality of light signals. This method involves providing the assembly and applying pump light to the arrays to produce electron-hole pairs and enable optical gain. Signal light is applied to the arrays to trigger an emission from the quantum dot at the first location of a set and transmission of photons along the array to the second location of a set.

The present invention further relates to a method of making an assembly of multiple waveguides which includes providing a substrate and attaching a plurality of linker sets to the substrate. Each linker set is attached to the substrate sequentially and positioned between different sets of first and second locations on the substrate. Quantum dots are coupled to each of the plurality of linker sets to produce a plurality of waveguides positioned on the substrate at locations effective to suppress cross-talk between different waveguides. The plurality of waveguides each comprises an elongate array of quantum dots extending between the different sets of first and second locations on the substrate. This plurality of waveguides is positioned to receive: (1) pumped light uniformly applied to the array to produce electron-hole pairs and to enable optical gain and (2) signal light at the first location of an array to trigger an emission from the quantum dot at the first location and transmission of photons along the array to the second location of that array.

Each of the plurality of linker sets on said substrate may be comprised of an oligonucleotide which hybridizes to the same nucleotide sequence but not to nucleotide sequences to which oligonucleotides in other linker sets on the substrate hybridize.

The quantum dots are coupled to each of the plurality of linker sets by providing a plurality of complexes of quantum dots attached to an oligonucleotide. The same quantum dot is coupled to an oligonucleotide which hybridizes to the same nucleotide sequence but not to the nucleotide sequences to which oligonucleotides attached to other quantum dots hybridize. The plurality of complexes of quantum dots attached to an oligonucleotide are coupled to the substrate under conditions effective to permit hybridization between oligonucleotides in the linker sets and the complexes. Each array of the substrate contains quantum dots that are the same as one another but different than those in other arrays on the substrate.

The plurality of linker sets are attached to the substrate by attaching functional groups to the substrate at locations corresponding to where a particular linker set is to be attached to the substrate. An oligonucleotide may be attached to the functional groups on the substrate at the locations corresponding to where a particular linker set is to be attached to the substrate. The steps of applying functional groups and attaching an oligonucleotide to the functional groups on the substrate are repeated individually and sequentially for each of the plurality of linker sets to be attached to the substrate.

In attaching an oligonucleotide to the functional group on the substrate, a chemical linker is attached to the functional groups on the substrate at the locations corresponding to where a particular linker set is to be attached to the substrate. The oligonucleotide is attached to the chemical linker on the substrate at the locations corresponding to where a particular linker set is to be attached to the substrate.

In producing the assembly, a coating is applied on the substrate and that coating is patterned to form the locations for attaching functional groups to the substrate. The patterned coating is removed from the substrate before coupling quantum dots to each of the plurality of linker sets. The coating can be a material capable of being patterned by lithography, such as polymethylmethacrylate.

The process begins with spin-coating polymethylmethacrylate on a silicon/silicon dioxide substrate. Electron-beam lithography enables patterning on the polymer surface to generate trenches on the surface of PMMA, defining the global shape of the waveguide. The number of exposed hydroxyl groups at the bottom of these trenches is increased by a short exposure to oxygen plasma.

Figure 2C:
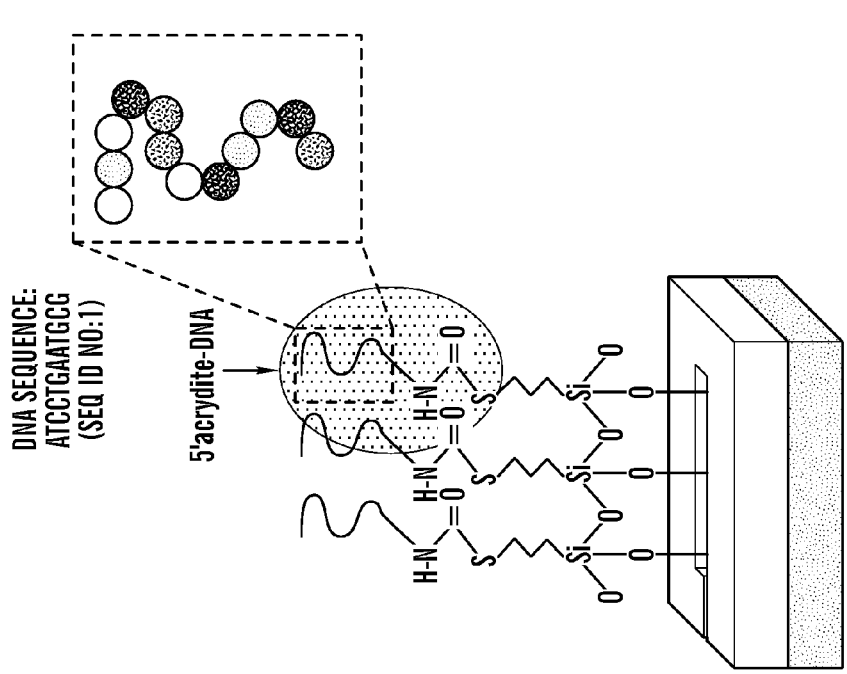
FIGS. 2A-E shows DNA-mediated QD waveguide fabrication.
Figure 2B:
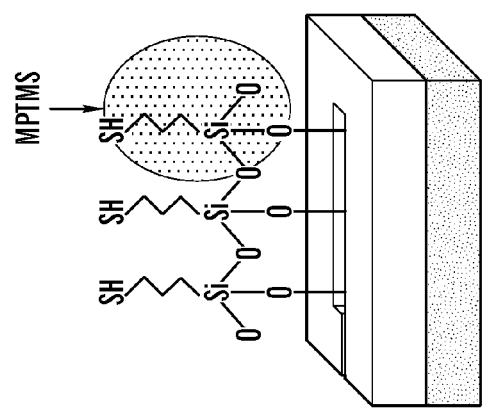
Figure 2A:
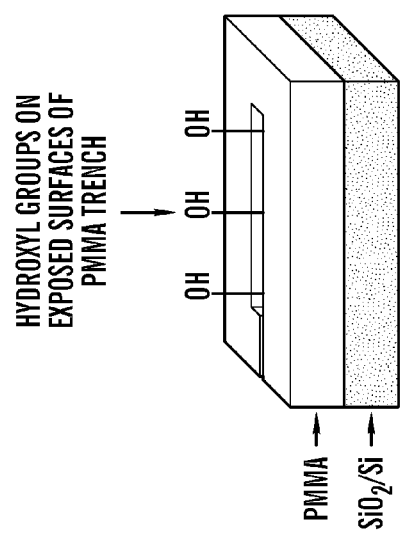
Figure 2D:
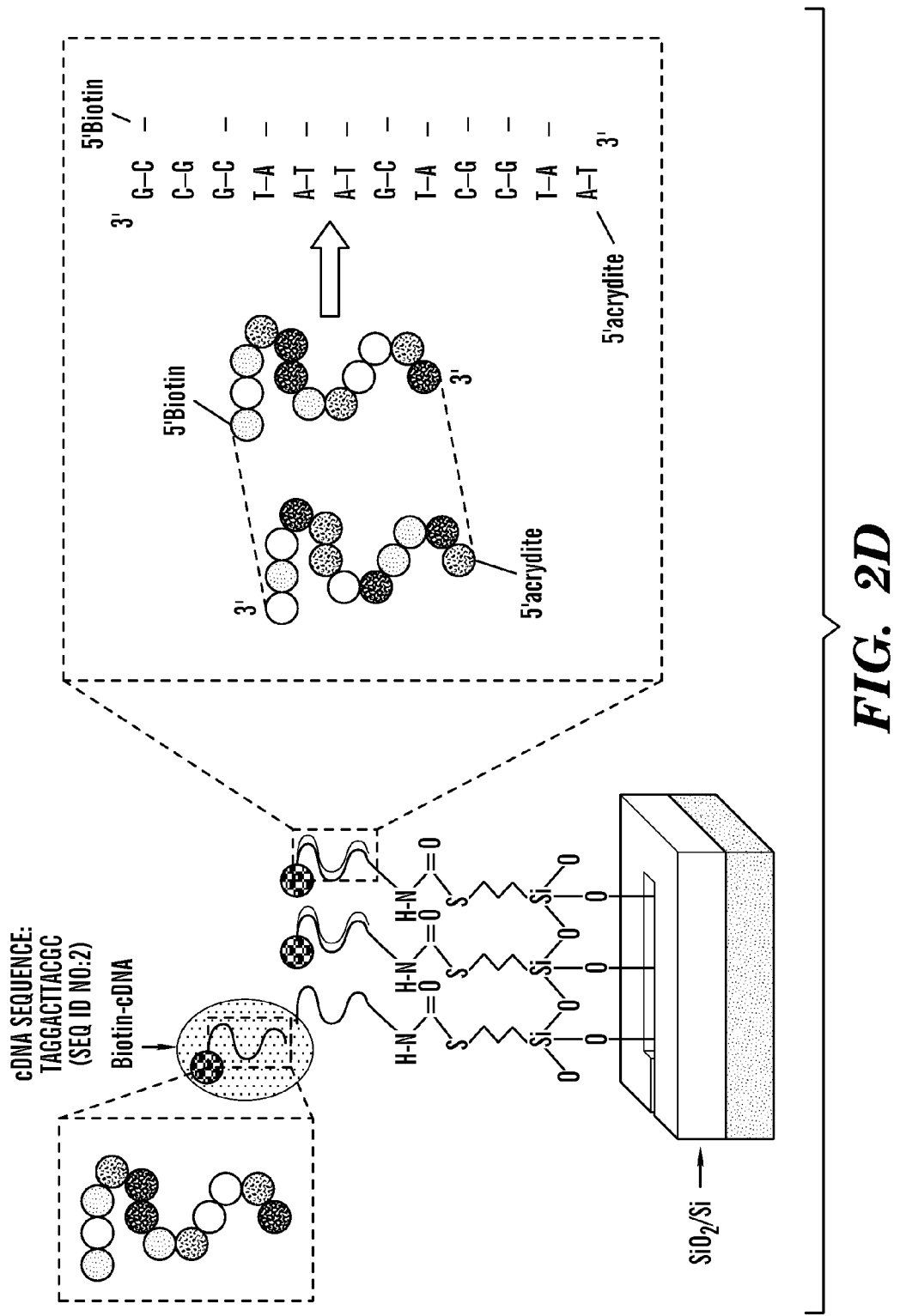
Figure 2E:
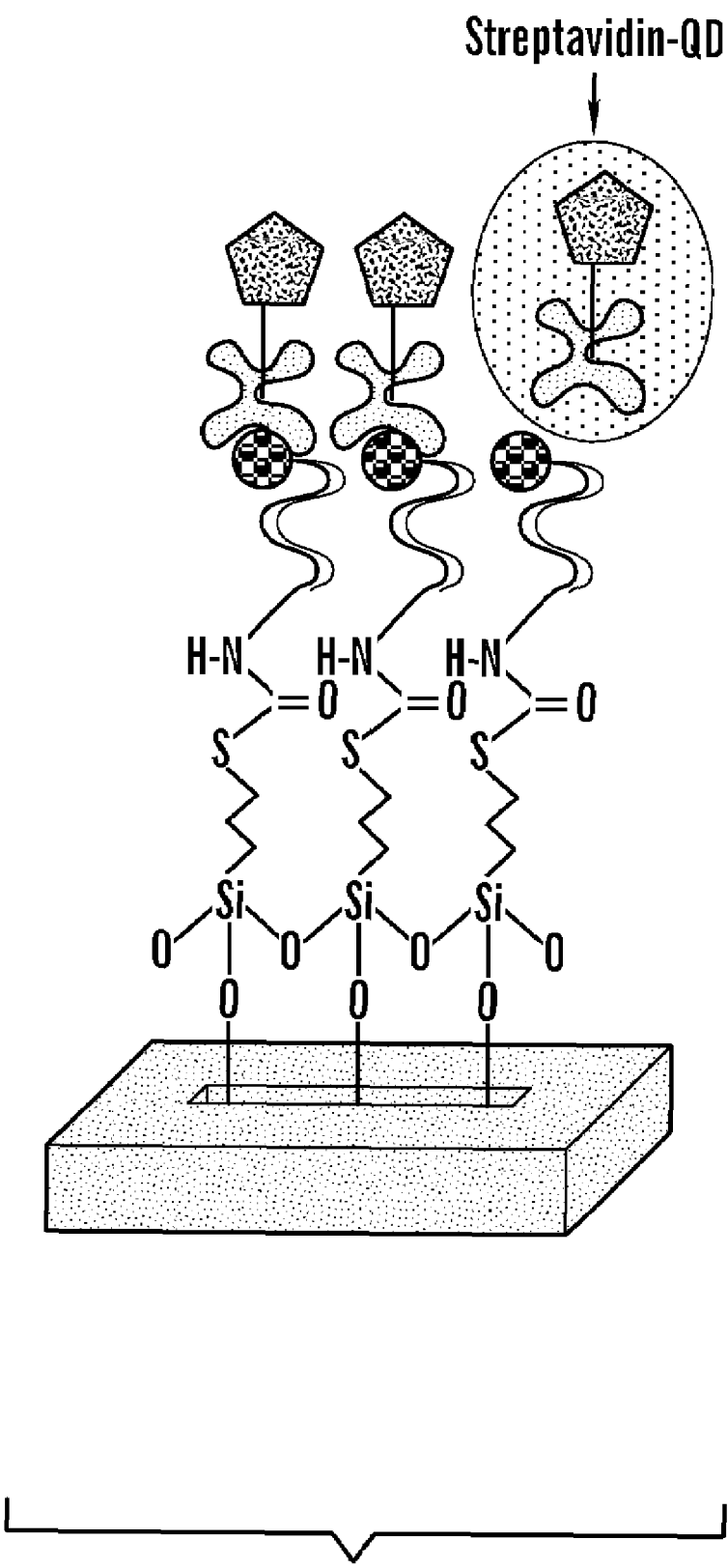

In the DNA-based technique, whose procedure is depicted in FIGS. 2A-E, the substrate is functionalized with —OH groups (FIG. 2A) which act as an anchor for gas phase self-assembly and covalent binding of 3-mercaptopropyltrimethoxysilane (MPTMS) molecules (FIG. 2B). Formation of a monolayer of MPTMS at the bottom of the PMMA trenches provides exposed thiol (SH) termini for the subsequent binding step and Michael addition of acrylamide modified single-stranded DNA (ss-DNA) to the thiol groups, enabling specific binding of the ss-DNA to the bottom of the PMMA trenches (FIG. 2C). Consequently, the ss-DNA is free to bind to the exact complementary chain creating a programmable location for the self-assembly of the next part of the device (FIG. 2D). Prior to the DNA hybridization step, immersion of the sample in buffered acrylic acid passivates the non-reacted MPTMS, and, then, a droplet of the complementary DNA (cDNA) chain customized with a biotin terminator in solution form is placed onto the surface. Next, 655 nm emission quantum dots conjugated to streptavidin, which is a protein that preferentially attaches to biotin, is introduced (FIG. 2E). In the final step, a dichloromethane rinse dissolves the PMMA to leave the QD pattern, secured to the substrate by linking chemistries.

As the streptavidin linked QD deposit in biotin available areas, the base sequence of the biotin-cDNA is the critical factor in device formation. As a result, an element of selectivity and specificity is accorded the system and may be exploited in a number of ways. To allow for mass processing, a possibility for multiple patterns is to deposit the base layer DNA in stages such that different sequences are presented at separate regions. On the QD side, several streptavidin-QD solutions, each unique and in individual containers, can be reacted with the biotin modified complementary DNA chains of the acrydite terminated DNA. A mass self-assembly step may then be done where the sample is simultaneously exposed to all the different nanocrystal solutions and with slight agitation to aid in transport of the QD-DNA groups, selective hybridization occurs. Consequently, the quantum dots will be placed according to the acrydite-DNA patterns.

Figure 5A:
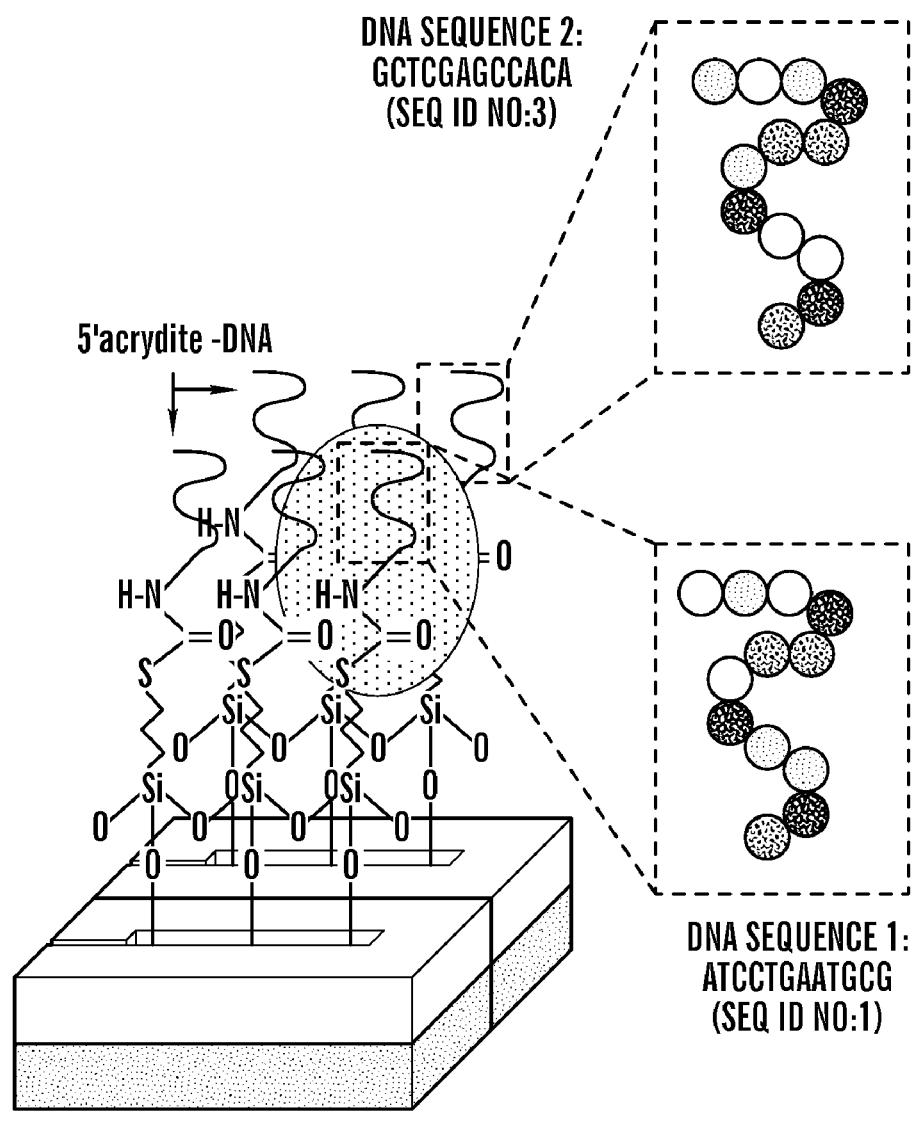
Figure 5C:
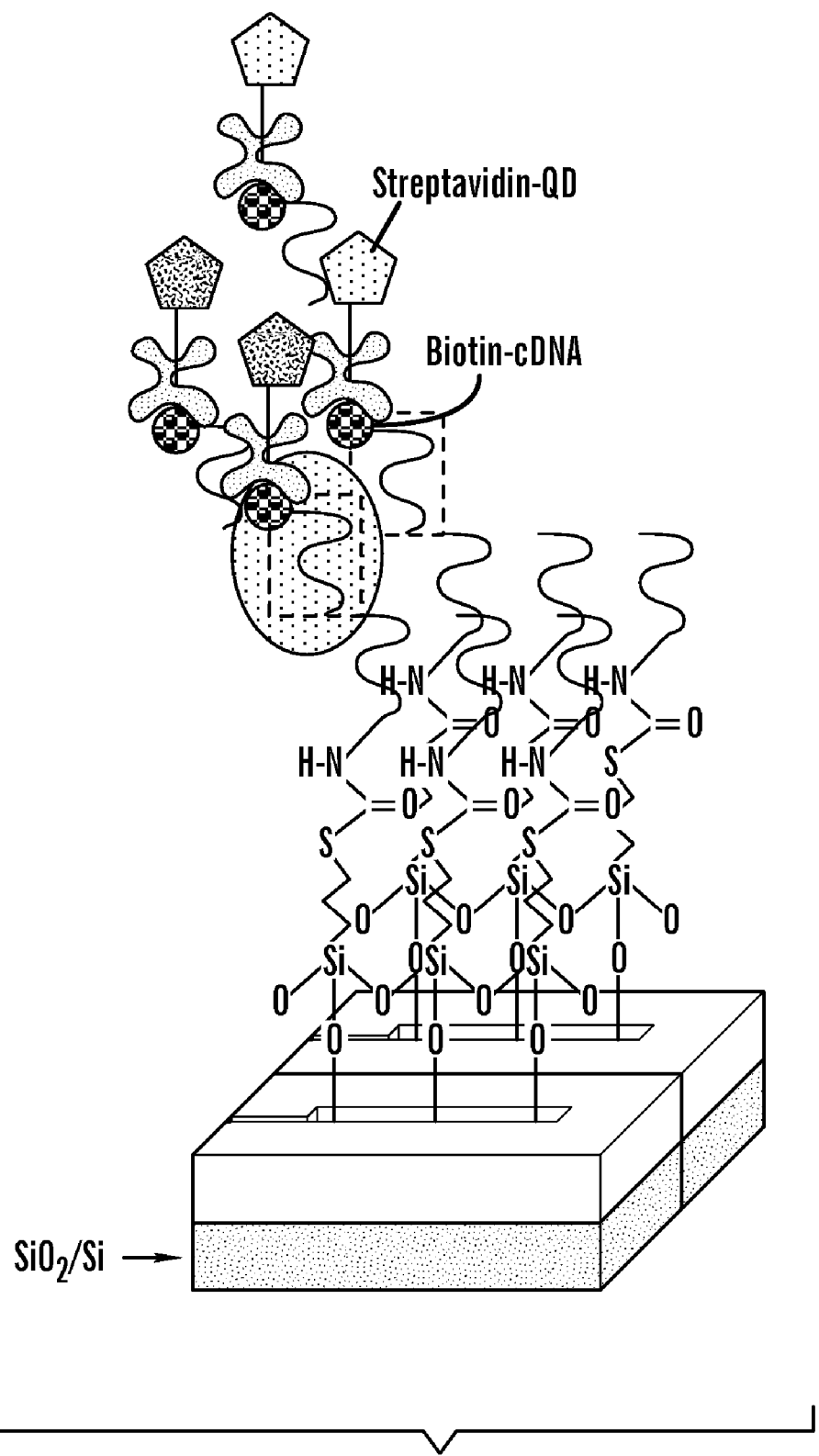
Figure 5D:
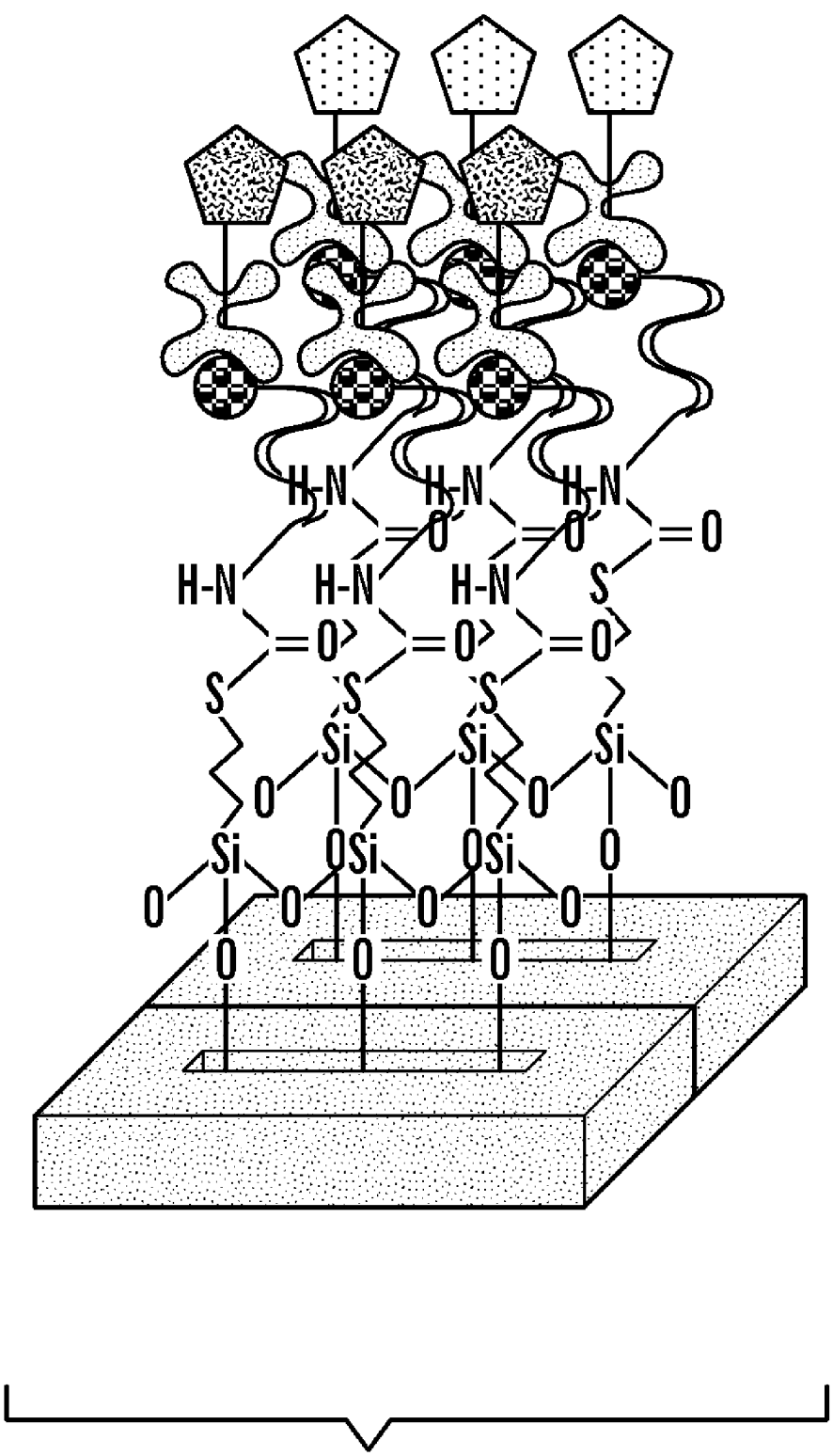

The current procedure interjects a repeated series of steps after completing the first process through the point of 5' acrydite-DNA of the DNA-directed self-assembly process (FIGS. 5A-D). Namely, there is an extra cycle of EBL patterning, MPTMS gas phase assembly and solution deposition of a second 5' acrydite-DNA, whose sequence is designed for minimal overlap with the first. Subsequently, fabrication continues with a 1× PBS rinse, $N_2$ blow dry, and passivation of MPTMS with buffered acrylic acid. Meanwhile, biotin-modified complementary DNA is reacted in a 40:1 concentration with streptavidin conjugated quantum dots in 1× PBS, where cDNA #1 and #2 are combined in separate tubes with 655 nm and 565 nm emission wavelength QDs, respectively (FIG. 5C). Then, the two solutions are dropped on the sample and left to hybridize with the corresponding acrylamide terminated DNA strands (FIG. 5D). After thirty minutes, the coupon is rinsed and immersed for 10 minutes in 2× SSPE and then rinsed with 0.3 M ammonium acetate and dried with $N_2$. At this step, the sample can be checked under the fluorescence microscope before submerging in toluene to remove the PMMA layer, washed with IPA, and blown dry with $N_2$.

On the other hand, the two-step method given in FIG. 3A-C uses 3' aminopropyltriethoxylsilane (APTES) to bind to the hydroxyl groups providing an aminated surface for further chemical reactions (Hu et al., *IEEE Trans. Nanotech* 4:312 (2005), which is hereby incorporated by reference in its entirety). As a result, carboxylated quantum dots suspended in 1× phosphate buffer solution (PBS) mixed with 1-ethyl-3-(3 dimethylaminopropyl)-carbodiimide (EDC), an amine-carboxyl coupling reagent, may be used. After dropping the solution onto the sample and waiting for one to two hours during which the QDs bind to the sample, excess material is rinsed off with buffer, and, then, the PMMA is similarly removed by dichloromethane to reveal the waveguides.

The APTES-based deposition of multiple quantum dot types directly repeats the steps of the single type process of FIGS. 3A-C. FIGS. 4A-H depict the steps for two QD type patterning, whereby after the initial nanocrystals are anchored (FIG. 3C), the entire sample is coated with PMMA. Then, an e-beam lithography is used and the secondary patterns are developed. The coupon is treated with oxygen plasma (FIG. 4E) and immersed with APTES in solvent (FIG. 4F). As before, a droplet of carboxylated quantum dots mixed with the coupling reagent, EDC, is placed on the surface, and, after two hours, the sample is rinsed (FIG. 4G). Finally, the PMMA is removed with dichloromethane or another stripping solvent to reveal both patterns (FIG. 4H).

EXAMPLES

Example 1

Evaluation of Gain Per Quantum Dot

Figure 6:
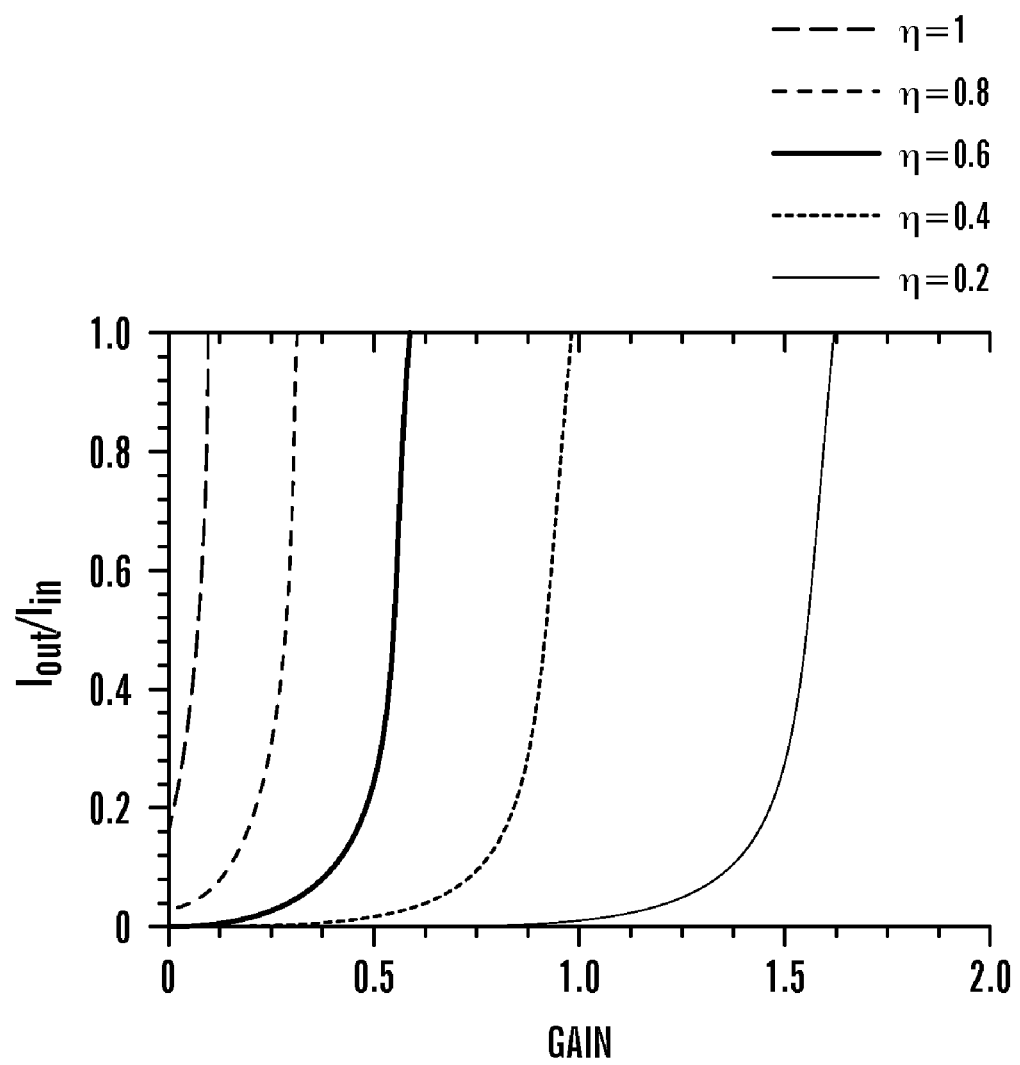
FIG. 6 shows the relative output intensity as a function of gain per quantum dot for a 1D array waveguide using varied inter-dot coupling coefficients η.

Prior modeling of the gain response for 5 nm×5 nm×5 nm CdSe/ZnS core/shell quantum dots indicates that there is net emission occurring between 0.1 and 1 nW optical pump power, with absorption dominating at the low end and gain saturation at the higher end (Wang et al., *IEEE J. of Select. Topics in Quantum Electron.* 11:500 (2005), which is hereby incorporated by reference in its entirety). Furthermore, implementing an ABCD transfer matrix technique allows estimation of the relative output intensity with respect to coupling coefficient between two QDs and the gain parameter inherent in each. The results show a tradeoff between gain and coupling where a smaller value for one may compensate a higher value for the other to attain high transmission efficiency. FIG. 6 depicts the simulation result of transmission efficiency for a waveguide composed of a five QD 1D-array waveguide.

Example 2

Evaluation of Layer Deposition

To provide an element of selectively, single-stranded DNA (ss-DNA) and its complementary chain (cDNA) are used to program the binding of nanocrystals to the substrate and present a means for depositing an array of structures tailored to operate at different wavelengths. The procedure (shown in FIG. 2) to build a sub-diffraction limit waveguide begins with cleaving a small coupon, generally 1 cm×1 cm area, from an oxidized silicon wafer. The sample is cleaned by rinsing with xylene, acetone, isopropyl alcohol (IPA), and de-ionized (DI) water followed by drying with nitrogen gas, $N_2$ (Ramanath et al., "Self-assembled Subnanolayers as Interfacial Adhesion Enhancers and Diffusion Barriers for Integrated Circuits," *Appl. Phys. Lett.* 83(2):383-385 (2003), which is hereby incorporated by reference in its entirety). Then, the sample is spin-coated with polymethylmethacrylate (PMMA), which acts as a positive resist and soft baked on a hot plate before placing in the EBL chamber. After using e-beam lithography to write a pattern on the substrate, the sample is removed from the chamber. Upon developing the PMMA, the areas exposed to the electron beam dissolve and are rinsed away, baring selected areas of the silicon oxide. Subsequently, the coupon is primed for hydroxyl (—OH) group surface reactions by brief treatment in the oxygen plasma chamber. Due to the system tendency for energy minimization, the OH molecules naturally link with dangling silicon bonds at the oxide interface via covalent binding.

Next, the sample is placed in a vacuum ready chamber and 3-mercaptopropyltrimethoxysilane (MPTMS) is deposited as the first self-assembled molecular layers (SAM). MPTMS, which is an organic silane compound, has the useful property of having its hydrocarbon terminating in one end with a silicon atom linked to three hydroxyl groups and in the other with a sulfur-hydrogen (SH) molecule, termed a mercapto or thiol group. Consequently, a gas phase reaction between the compound and the substrate will result in formation of a monolayer with the thiol groups presented at the outer surface. The sample is left to react with MPTMS for two hours, and, then, the vacuum is turned on for one hour to evacuate the chamber and remove excess MPTMS. A rinse with IPA followed by $N_2$ dry and a hot plate mediated purge step further ensures the construction of a mono—and not multilayer (Kurth et al., "Surface-reactions on Thin-layers of Silane Coupling Agents," *Langmuir* 9(11):2965-2973 (1993), which is hereby incorporated by reference in its entirety). The second SAM to be incorporated with the sample is a DNA chain 5' terminated with an acrydite molecule, and the step is accomplished by placing a few droplets of the biological solution, generally on the order of tens of μM concentration, on the patterned region. The acrydite interacts with the thiol group, prompting formation of another covalent bond, which leaves the DNA available to hybridize with the exact complementary chain (cDNA) (Demers et al., "Direct Patterning of Modified Oligonucleotides on Metals and Insulators by Dip-pen Nanolithography," *Science* 296:1836-1838 (2002), which is hereby incorporated by reference in its entirety). The sequence of bases (i.e. SEQ ID NO: 1 and its complement) for the acrydite-DNA strand is given in FIG. 3D.

Figure 7:
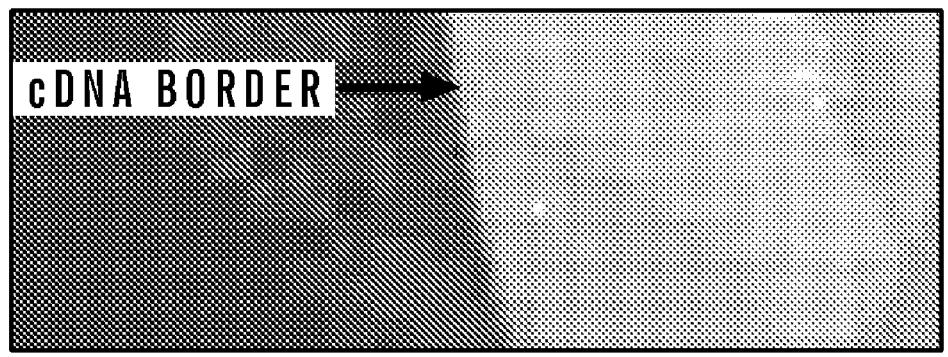
FIG. 7 shows a fluorescence image depicting the presence of Oregon Green-cDNA on only acrydite-DNA regions.

The acrydite-DNA solution is allowed to sit on the sample overnight to produce high density coverage. On the following day, the sample is rinsed with 1× phosphate buffer solution (PBS), dried with $N_2$, and treated with buffered acrylic acid to passivate regions of inactivated MPTMS. After another PBS rinse and $N_2$ drying step, the cDNA solution is added. In the first series of patterning experiments, Oregon Green fluorophore labeled cDNA strands were used for the final chemical binding thereby providing a convenient method to qualitatively check the DNA deposition. Upon confirmation of the DNA patterning ability (FIG. 7), the QD steps were appended to the process. Thus, to complete the waveguide, a solution mixed with biotin terminated cDNA in μM concentration is dropped on the sample. Left for thirty minutes, the DNA strands will hybridize and form a double helix as each base pair is matched to the complement over the entire length (see FIG. 3D). Extra DNA is removed by rinsing and immersing the coupon in 2× SSPE (combination of 0.3 M sodium chloride, 0.02 M sodium phosphate, 0.002 M ethylenediaminetetraacetic acid, 0.2% sodium dodecyl sulfate) (Demers et al., "Direct Patterning of Modified Oligonucleotides on Metals and Insulators by Dip-pen Nanolithography," *Science* 296: 1836-1838 (2002), which is hereby incorporated by reference in its entirety). Then, quantum dots conjugated with streptavidin protein are deposited in solution phase on the sample. Streptavidin has four active binding sites which preferentially attach to the biotin molecule and thus, anchor the QDs to the substrate. Once another thirty minutes has passed, the sample is thrice rinsed and immersed for 5 minutes to rid the surface of unbound molecules. Finally, the PMMA coating is stripped by submerging the sample in toluene for several minutes and then washed with IPA and dried with a stream of $N_2$.

Example 3

Evaluation of Layer Deposition

Figure 8A:
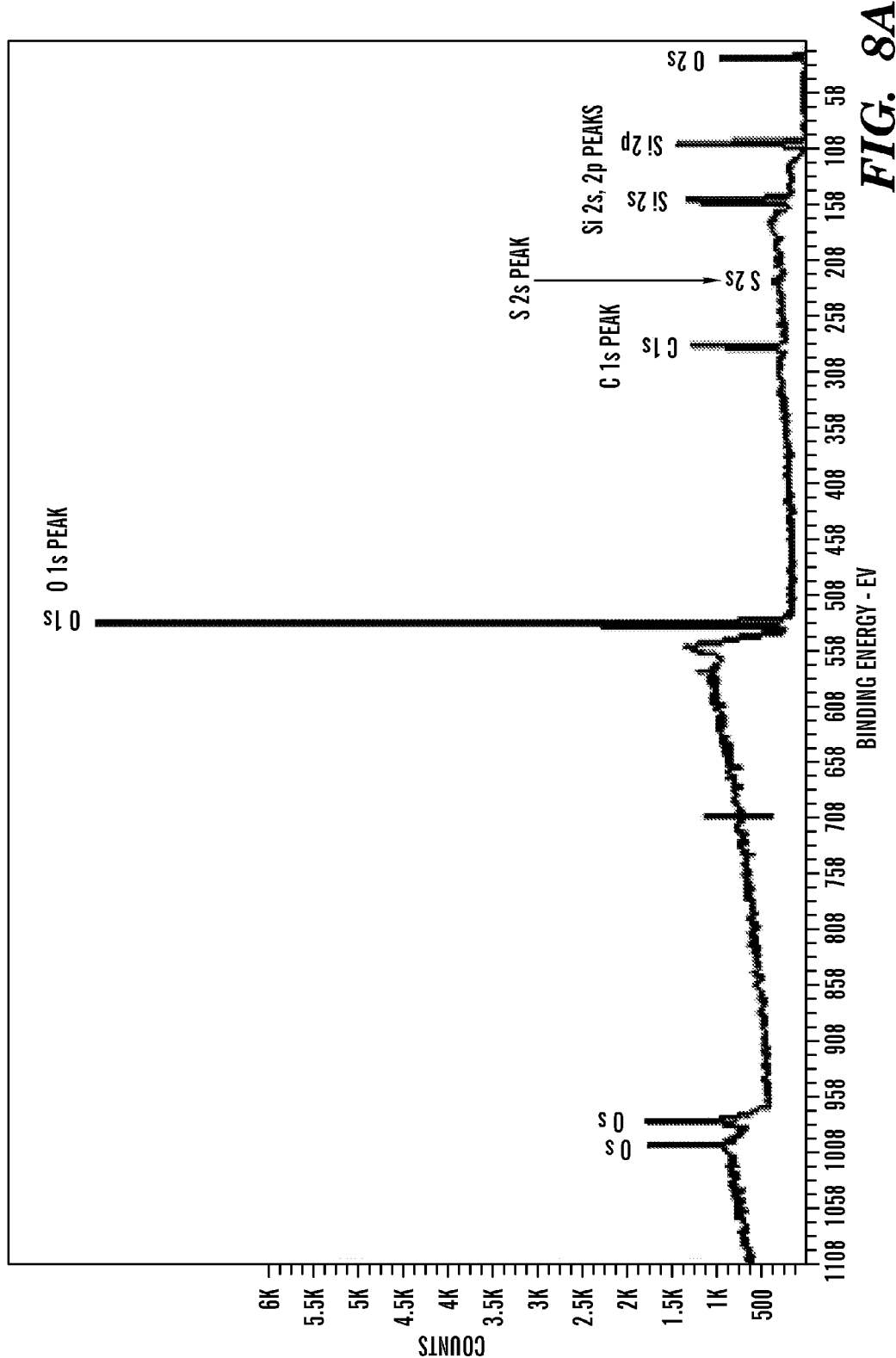
FIGS. 8A-B show DNA-mediated self-assembly of a quantum dot waveguide.
Figure 8B:
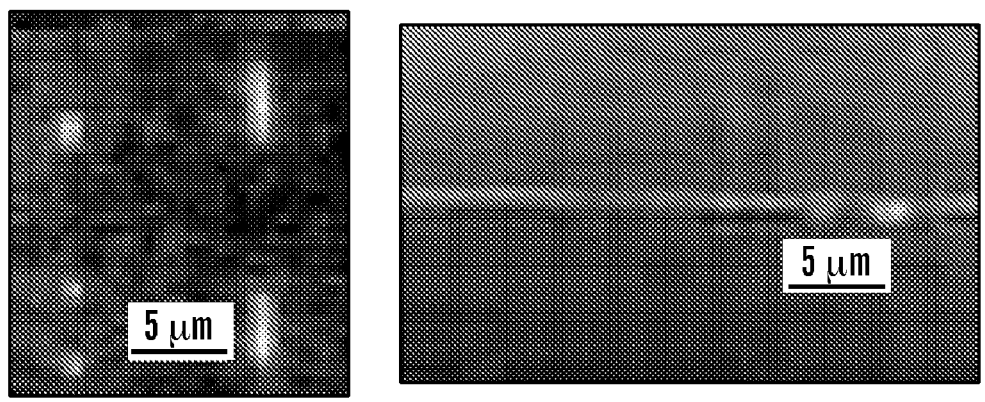

To check the deposition of the self-assembled molecular (SAM) layers, samples that underwent the assembly processes to control samples using x-ray photoelectron spectroscopy (XPS) were compared. The MPTMS results in FIG. 8A, which provide the percent composition of the elements in the top 10 nm of the surface, show sulfur content only for devices subjected to the deposition step. The peaks are labeled for the compounds of interest and the average % composition are found to be 48.9% oxygen, 25.7% silicon, 24.3% carbon, and 1.1% sulfur, reflecting the existence of the silicon dioxide substrate, inevitable carbon contamination, and MPTMS molecules. Further assembly steps using DNA are confirmed with fluorescence observation and examples of the final QD fluorescence patterns, in FIG. 8B, include an array of rectangles ranging in size from 5 μm×1 μm to 1 μm×1 μm, and a 1 μm wide waveguide.

Figure 9A:
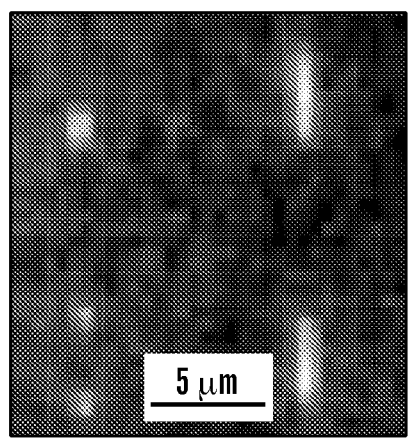
FIGS. 9A-C show images of patterned structures.
Figure 9B:
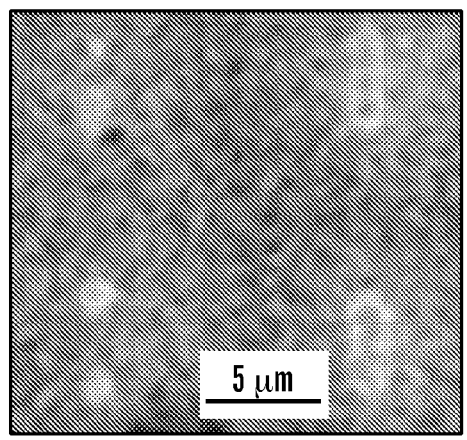
Figure 9C:
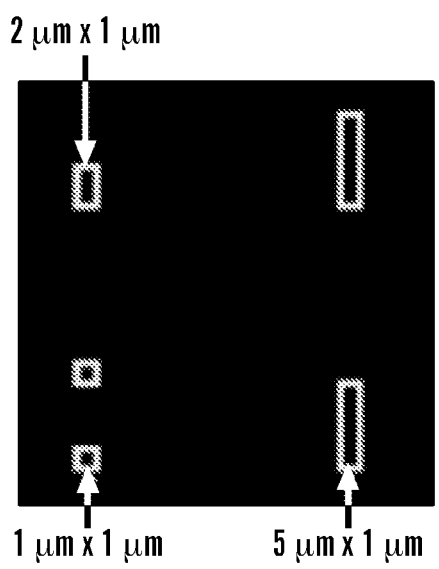

All formations including the smallest at 1 μm² are well defined. FIGS. 9A-C compare the QD fluorescence of 1 μm by 5 μm, 2 μm, and 1 μm patterns with the respective SEM and layout images to show a one to one match.

Figure 10A:
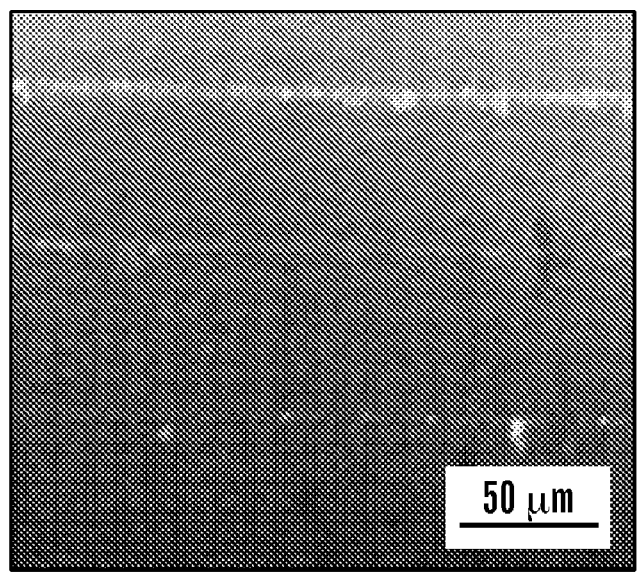
FIGS. 10A-B show the fluorescence image of 5, 1 and 0.5 μm width (FIG. 10A) and an SEM image of 0.5 μm width QD waveguides (FIG. 10B).
Figure 10B:
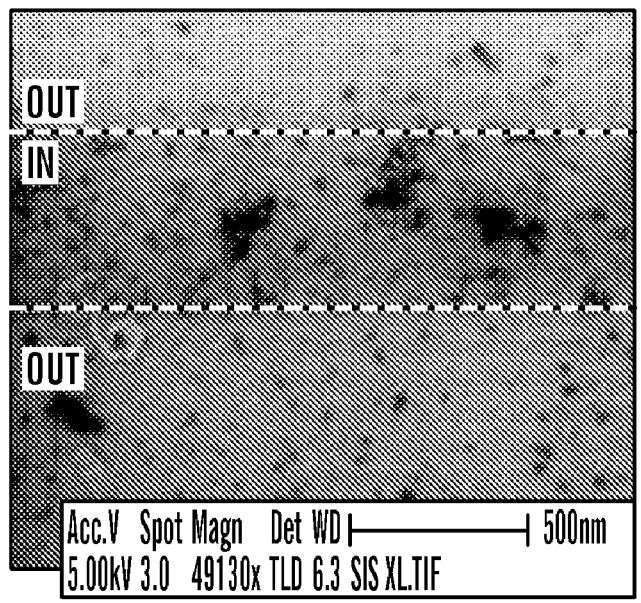

A DNA-mediated sample set involving a waveguide EBL pattern of 50 to 0.1 μm widths and 100 μm length visibly demonstrated line regions of fluorescence, given in FIG. 10A. The corresponding SEM of the 0.5 μm width waveguide (see FIG. 10B) further shows that QD deposition remains within the pattern. While the coverage shown in FIG. 10B is likely to be too sparse for the nanophotonic waveguide device, the density may be improved by increasing the nanocrystal solution concentration as well as agitating the sample by a small amount during deposition to circulate unattached particles. Moreover, the PMMA layer may be thinned by increasing the speed of spin coat rotations or using more dilute resists, thus allowing the SAM molecules to enter the patterned areas. There is some residue from the PMMA removal process, which presents another area for optimization. Regardless, the feasibility of each self-assembly step and the summation of parts show a process that can create a device with several different chemical layers. In addition, the fluorescence of the QDs provides the proof of the overall deposition quality.

Figure 11A:
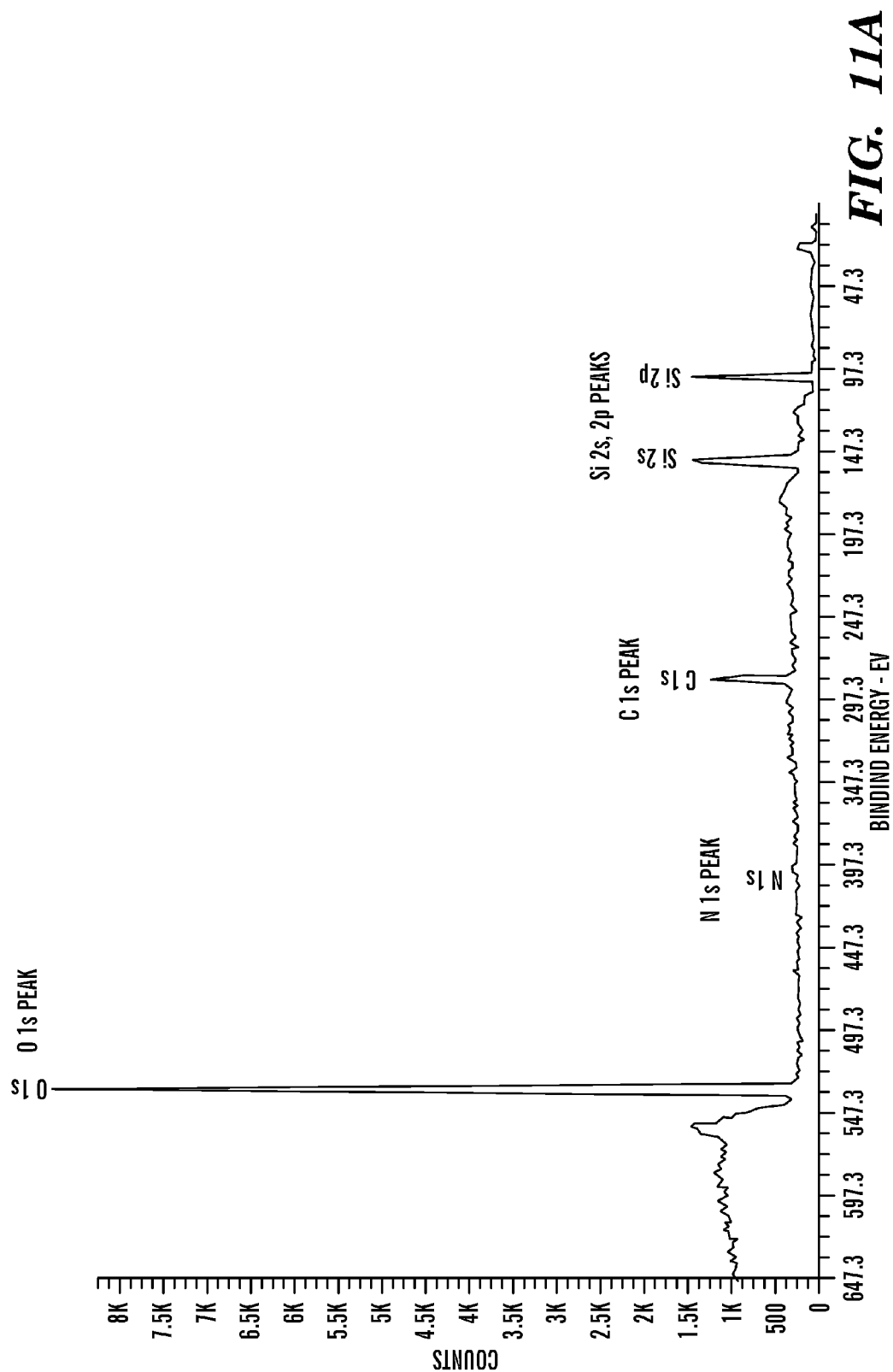
FIGS. 11A-C show two-layer self-assembly of quantum dot waveguide.
Figure 11B:
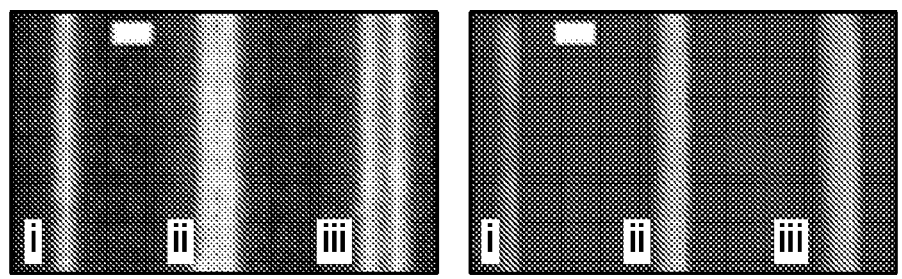
Figure 11C:
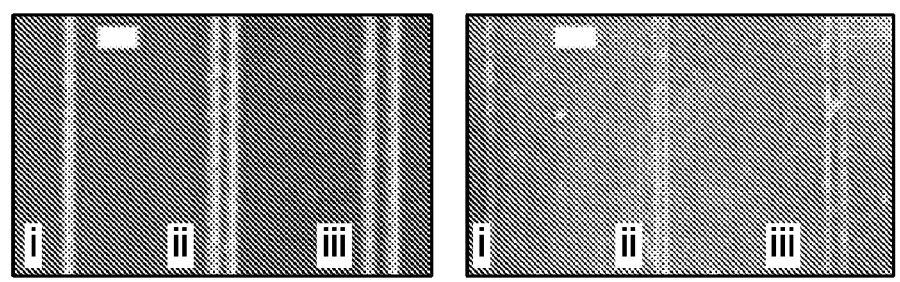
Figure 12A:
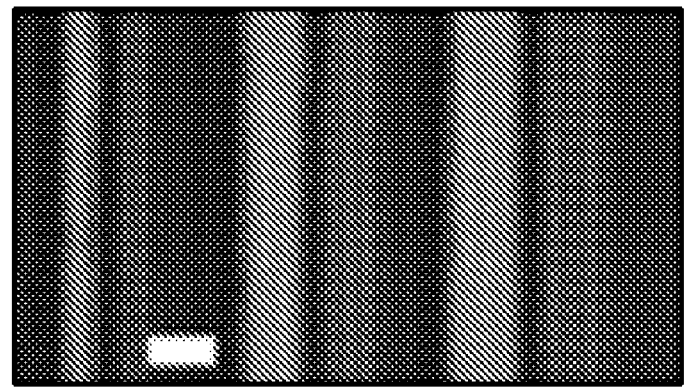
FIGS. 12A and 12B show the fluorescence (FIG. 12A) and atomic force (FIG. 12B) micrographs of a section of multiple quantum dot type waveguide structures; waveguide width is 500 nm, scale bar is 2 mm.
Figure 12B:
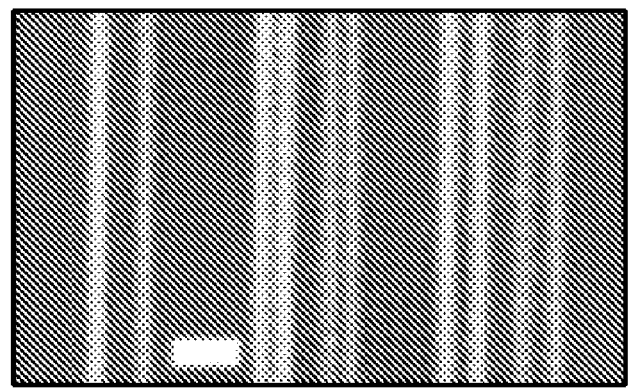

Likewise, APTES deposition is confirmed through XPS. FIG. 11A shows a typical XPS curve for samples covered with the aminated SAM, where the percent compositions are 1.2% nitrogen, 29.8% silicon, 54.5% oxygen, and 14.4% carbon. The ratio of the nitrogen peak to the other dominant elements is appropriate to coverage by APTES and lack of nitrogen in controls provides further verification. Fluorescence micrographs and AFM images in FIGS. 11B and 11C show attachment of 655 nm emission quantum dots aligned in the 100 and 500 nm width lines. To note, the 100 nm waveguides are diffraction-limited in terms of optically detecting a coherent line; however, the topographical profile demonstrates a continuous structure. FIGS. 12A and 12B show fluorescence and atomic force micrographs, respectively, of a section of multiple quantum dot type waveguide structure. The width of the waveguide is 500 nm, and the scale bar is 2 mm.

Example 4

Photodetection Testing

For testing, the sample is placed on a microscope stage and a pair of tapered fiber probes coupled to a 639 nm signal laser, which falls within the gain peak centered at 655 nm, and a photodetector is aligned to the input and output edges on the waveguide, respectively. A pump light, with 405 nm wavelength, is collimated and oriented overhead to illuminate the device and excite $e^--h^+$ pairs to create gain. With a 20× objective and the collimator in place, a maximum pump power distribution of 1.4 nW/QD corresponding to 4 mW over a 20 μm diameter is calculated, which is within the gain regime determined by the quantum dot model. Subsequently, ramping the pump level up and down while logging the photodetector measurements over time, with the signal laser on and off and the fibers aligned on and then off the waveguide, for a total of four cycles allows a determination of the effect of the waveguide in transmitting light.

Figure 13A:
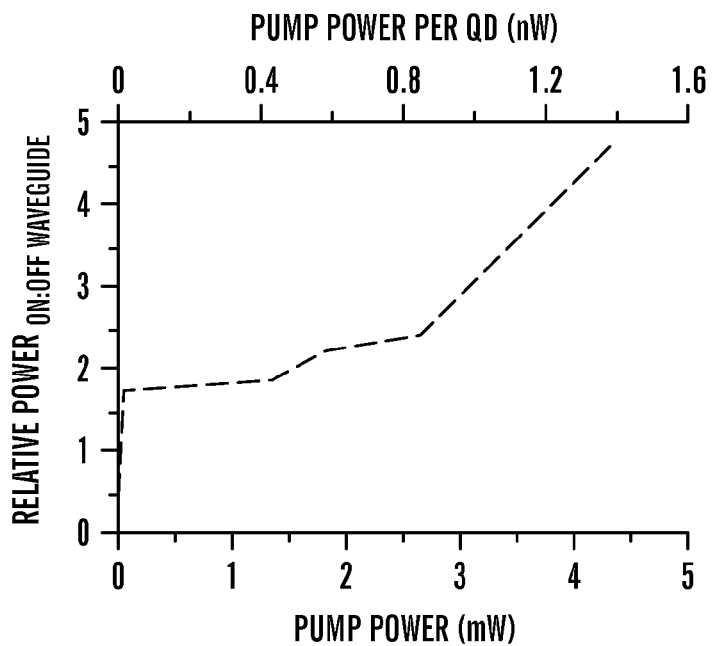
FIGS. 13A-B show data from 500 nm wide waveguide.
Figure 13B:
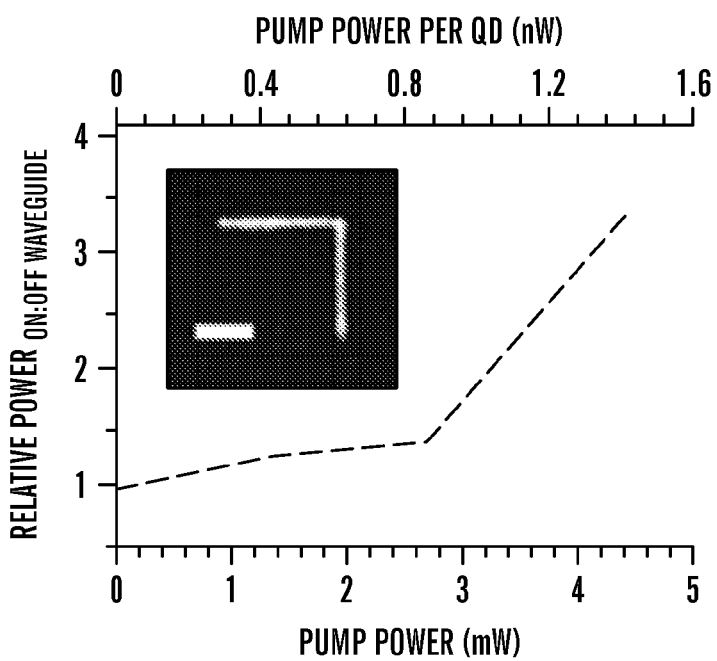

Each combination of pump and signal parameters is polled for every five seconds at a minimum of five minute duration with the collection of values averaged for further analysis. In general, the standard deviation is two orders of magnitude less than the mean. The effect of fluorescence from the waveguides is removed from the total level by subtracting the signal off from signal on readings at each pump power. Then, the resulting on waveguide reading may be divided by the off waveguide value to derive the effect of the quantum dots such that a parallel trend where increased pump power produces higher waveguide to substrate ratios indicates transmission of light by the waveguide. Looking at straight 10 μm long and 10

μm×10 μm corner 500 nm wide waveguides in FIG. 13, the behavior follows the expected pattern where the relative transmission increases with pump light.

The comparable performance between the cornered waveguide and the straight waveguide shows the promise of extremely flexible routing using the proposed self-assembled colloidal quantum dot waveguides. This is one main advantage compared to conventional dielectric waveguides besides sub-diffraction waveguiding and is important for realizing ultra-high-density photonic integrated circuits.

Overall, two different self-assembly fabrication methods for colloidal quantum dot waveguides are introduced, where the DNA-mediated process provides an element of programmability while the two-layer, APTES-based procedure allows for rapid prototyping. Both may be extended towards deposition of multiple quantum dot type structures to reduce crosstalk between waveguides. Furthermore, waveguiding is observed in straight and corner devices such that the transmitted signal levels increase with pump power on the whole and indicate the potential for a gain-enabled and wavelength-selective nanophotonic waveguide.

Energy transfer through quantum dot waveguide has been demonstrated with corroboration among separate devices. The device provides a cornerstone in nanophotonic circuits. Furthermore, the ability to guide light through corners on the nanoscale using quantum dots may set a precedent for flexible on-chip routing.

Although preferred embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims which follow.

What is claimed:

1. An assembly of multiple waveguides, said assembly comprising:
   a substrate and
   a plurality of waveguides positioned on said substrate at locations effective to suppress cross-talk between different waveguides, said plurality of waveguides each comprising:
      an elongate array of quantum dots extending between a set of first and second locations on the substrate and positioned to receive: (1) pumped light applied to the array to produce electron-hole pairs and to enable optical gain and (2) signal light at the first location to trigger an emission from the quantum dot at the first location and transmission of photons along the array to the second location.

2. The assembly of claim 1, wherein each of the waveguides are straight.

3. The assembly of claim 1, wherein each of the waveguides are bent.

4. The assembly of claim 1, wherein each array of said substrate contains quantum dots that are the same as one another but are different than those in other arrays on the substrate.

5. The assembly of claim 1, wherein said substrate is made of a material capable of being functionalized with hydroxyl groups.

6. The assembly of claim 1, wherein said substrate is made of silicon dioxide on silicon.

7. The assembly of claim 1, wherein said substrate is functionalized with hydroxyl groups.

8. The assembly of claim 1 further comprising:
   a linker coupling the quantum dots to said substrate.

9. The assembly of claim 8, wherein the linker is a silane chain with amine or mercapto/thiol terminations.

10. The assembly of claim 9, wherein the linker is aminopropyltriethoxysilane or mercaptopropyltrimethoxysilane.

11. The assembly of claim 8, wherein the linker is one or more nucleic acid molecule.

12. The assembly of claim 11, wherein the linker comprises a pair of complementary nucleic acid molecules, with one of the nucleic acid molecules coupled to the substrate and one of the nucleic acid molecules coupled to the quantum dot.

13. The assembly of claim 8, wherein the linker comprises a single nucleic acid molecule.

14. The assembly of claim 1, wherein each quantum dot is coupled to the substrate with a streptavidin-biotin binding pair.

15. The assembly of claim 1, wherein the quantum dots are made from semiconducting elements such as Group I-VII elements, Group II-VI elements, or Group III-V elements.

16. A light transmission system comprising:
   the assembly of claim 1;
   one or more sources of pump light positioned to apply light to the arrays to produce electron-hole pairs and to enable optical gain;
   one or more sources of signal light positioned to trigger an emission from the quantum dot at the first location of a set and transmission of photons along the array to the second location of a set; and
   a light receiver positioned to receive photon transmission at the second location of a set.

17. A method of transmitting a plurality of light signals, said method comprising:
   providing the assembly of claim 1;
   applying pump light to the arrays to produce electron-hole pairs and enable optical gain; and
   applying signal light to the arrays to trigger an emission from the quantum dot at the first location of a set and transmission of photons along the array to the second location of a set.

18. A method of making an assembly of multiple waveguides, said method comprising:
   providing a substrate;
   attaching a plurality of linker sets to the substrate, each linker set being attached to the substrate sequentially and positioned between different sets of first and second locations on the substrate;
   coupling quantum dots to each of the plurality of linker sets to produce a plurality of waveguides positioned on the substrate at locations effective to suppress cross-talk between different waveguides, said plurality of waveguides each comprising an elongate array of quantum dots extending between the different sets of first and second locations on the substrate and positioned to receive: (1) pumped light applied to the array to produce electron-hole pairs and to enable optical gain and (2) signal light at the first location of an array to trigger an emission from the quantum dot at the first location and transmission of photons along the array to the second location of that array.

19. The method of claim 18, wherein each array of the substrate contains quantum dots that are the same as one another but different than those in other arrays on the substrate.

20. The method of claim 19, wherein each of the plurality of linker sets on said substrate comprises an oligonucleotide which hybridizes to the same complementary nucleotide sequence but not to nucleotide sequences to which oligonucleotides in other linker sets on the substrate hybridize.

21. The method of claim 20, wherein said coupling quantum dots to each of the plurality of linker sets comprises:
   providing a plurality of complexes of quantum dots attached to an oligonucleotide, wherein the same quantum dot is coupled to an oligonucleotide which hybridizes to the same complementary nucleotide sequence but not to the nucleotide sequences to which oligonucleotides attached to other quantum dots hybridize and
   applying the plurality of complexes of quantum dots attached to an oligonucleotide to the substrate under conditions effective to permit hybridization between oligonucleotides in the linker sets and the complexes, whereby each array of the substrate contains quantum dots that are the same as one another but different than those in other arrays on the substrate.

22. The method of claim 20, wherein said attaching a plurality of linker sets to the substrate comprises:
   attaching functional groups to the substrate at locations corresponding to where a particular linker set is to be attached to the substrate;
   attaching an oligonucleotide to the functional groups on the substrate at the locations corresponding to where a particular linker set is to be attached to the substrate; and
   repeating said applying functional groups and said attaching an oligonucleotide to the functional groups on the substrate individually and sequentially for each of the plurality of linker sets to be attached to the substrate.

23. The method of claim 22, wherein said attaching an oligonucleotide to the functional group on the substrate comprises:
   attaching a chemical linker to the functional groups on the substrate at the locations corresponding to where a particular linker set is to be attached to the substrate and attaching the oligonucleotide to the chemical linker on the substrate at the locations corresponding to where a particular linker set is to be attached to the substrate.

24. The method of claim 22 further comprising:
applying a coating on the substrate;
patterning the coating to form the locations for said attaching functional groups to the substrate; and
removing the patterned coating from the substrate before said coupling quantum dots to each of the plurality of linker sets.

25. The method of claim 18 further comprising:
applying a coating on the substrate;
patterning the coating to form the locations for said attaching a plurality of linker sets to the substrate; and
removing the patterned coating from the substrate before said coupling quantum dots to each of the plurality of linker sets.

26. The method of claim 25, wherein the coating is a material capable of being patterned by lithography.

27. The method of claim 26, wherein the coating is polymethylmethacrylate.

28. The method of claim 18, wherein the substrate is made of silicon dioxide on silicon.

29. The method of claim 18, wherein said attaching a plurality of linker sets to the substrate comprises:
attaching functional groups to the substrate at locations corresponding to where particular linker sets are to be attached to the substrate and
attaching linker sets to the functional groups on the substrate at the locations corresponding to where particular linker sets are to be attached to the substrate.

30. The method of claim 29, wherein functional groups are hydroxyl groups.

31. The method of claim 18, wherein the linker is a silane chain with amine or mercapto/thiol terminations.

32. The method of claim 9, wherein the linker is aminopropyltriethoxysilane or mercaptopropyltrimethoxysilane.

33. The method of claim 18, wherein each quantum dot is coupled to the substrate with a streptavidin-biotin binding pair.

34. The method of claim 18, wherein the quantum dots are made from semiconducting elements such as Group I-VII elements, Group II-VI elements, or Group III-V elements.

* * * * *